(12) United States Patent
Yoshida

(10) Patent No.: US 6,803,592 B2
(45) Date of Patent: Oct. 12, 2004

(54) POSITION DETECTION METHOD AND POSITION DETECTOR, EXPOSURE METHOD AND EXPOSURE APPARATUS, AND DEVICE AND DEVICE MANUFACTURING METHOD

(75) Inventor: Kouji Yoshida, Tokyo (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/438,870

(22) Filed: May 16, 2003

(65) Prior Publication Data

US 2003/0197136 A1 Oct. 23, 2003

Related U.S. Application Data

(63) Continuation of application No. 09/931,258, filed as application No. PCT/JP00/00855 on Feb. 16, 2000, now abandoned.

(30) Foreign Application Priority Data

Feb. 17, 1999 (JP) .......................................... 11-038220
Aug. 31, 1999 (JP) .......................................... 11-245047

(51) Int. Cl.$^7$ .............................................. G01N 21/86
(52) U.S. Cl. ........................................ 250/548; 356/401
(58) Field of Search ............................ 250/548, 559.29; 356/400, 401; 355/53

(56) References Cited

U.S. PATENT DOCUMENTS 4,780,617 A * 10/1988 Umatate et al. ............ 250/548
4,823,012 A    4/1989 Kosugi ....................... 250/491.1
5,805,866 A    9/1998 Magome et al. .............. 716/19
6,333,786 B1  12/2001 Uzawa et al. ................ 356/401

FOREIGN PATENT DOCUMENTS

| JP | 60-123706 | 7/1985 |
| JP | 6-348851 | 12/1994 |
| JP | 9-236906 | 9/1997 |

* cited by examiner

*Primary Examiner*—Thanh X. Luu
(74) *Attorney, Agent, or Firm*—Oblon, Spivak, McClelland, Maier & Neustadt, P.C.

(57) ABSTRACT

A parameter calculation unit statistically calculates the estimations and their certainty of a predetermined number of parameters, which uniquely specify any position on an object, for each of a plurality of measured sample sets on the basis of position information of marks composing the sample set. A valid value calculation unit calculates statistically valid values of the predetermined number of parameters on the basis of groups of the estimations and their certainty of the predetermined number of parameters for the respective sample sets. Furthermore, an evaluation unit statistically evaluates if the number of marks composing a sample set can be reduced. If it is determined that the number of marks can be reduced, the parameter calculation unit calculates values of the predetermined number of parameters by using a new sample set having reduced number of marks. Using the values of the predetermined number of parameters calculated in this manner, the position of any area on the object can be accurately detected.

56 Claims, 15 Drawing Sheets

POSITION DETECTION METHOD AND POSITION DETECTOR, EXPOSURE METHOD AND EXPOSURE APPARATUS, AND DEVICE AND DEVICE MANUFACTURING METHOD

CROSS-REFERENCE TO RELATED APPLICATIONS

This application is a continuation application of parent application Ser. No. 09/931,258, filed on Aug. 17 2001, now abandoned, which is a continuation application of PCT/JP00/00855, filed Feb. 16, 2000, the entire content of which is hereby incorporated herein by reference.

BACKGROUND OF THE INVENTION

1. Field of the Invention

The present invention relates to a position detection method and position detector, an exposure method and exposure apparatus, and a device and device manufacturing method and, more particularly, to a position detection method and position detector for obtaining arrangement information of divided areas on an object, an exposure method and exposure apparatus using the position detection method, and a device manufactured using the exposure method and a manufacturing method thereof.

2. Description of the Related Art

In a lithography process for making semiconductor devices, liquid crystal display devices, and the like, an exposure apparatus which transfers a pattern formed on a mask or reticle (to be generally referred to as a "reticle" hereinafter) onto a substrate (to be referred to as a "sensitive substrate or wafer" as needed hereinafter) such as a wafer, glass plate, or the like coated with a resist or the like via a projection optical system is used. As such an exposure apparatus, stationary exposure type projection exposure apparatus such as a so-called stepper, or a scanning exposure type projection exposure apparatus such as a so-called scanning stepper is mainly used.

In these exposure apparatuses, position adjustment (alignment) between a reticle and wafer must be accurately performed prior to exposure. To achieve this alignment, position detection marks (alignment marks) are formed (transferred by exposure) in the previous lithography process on the wafer in each of shot regions, and the position of the wafer (or a circuit pattern on the wafer) can be detected by detecting the positions of the alignment marks. Alignment is performed on the basis of the detection results of the positions of the wafer (or a circuit pattern on the wafer).

Such alignment schemes include a die-by-die scheme for performing alignment by detecting alignment marks in each shot, and an enhanced global alignment (to be abbreviated as "EGA" hereinafter) scheme for, after measuring alignment marks (position adjustment marks transferred together with a circuit pattern) at several positions in a wafer, computing arrangement coordinate positions of each shot area by a statistical scheme such as a least square approximation and, upon exposure, stepping a wafer using the accuracy of a wafer stage and the computation result. This EGA scheme is disclosed in, e.g., Japanese Patent Laid-Open No. 61-44429 and corresponding U.S. Pat. No. 4,780,617. Of these schemes, the EGA scheme is prevalently used nowadays in terms of the throughput of the apparatus.

In this EGA scheme, in order to determine a plurality of parameters that uniquely specifies the actual arrangement coordinate positions of shot areas relative to ideal arrangement coordinate positions in terms of design, more positions of alignment marks than the minimum number of those required to obtain the plurality of parameters are measured. Then, statistically valid parameter values are determined using a statistical scheme such as a least square approximation.

Upon applying such statistical scheme, error analysis is performed under the premise that "all position measurement results of alignment marks have the same reliability" (hereafter, this case is referred to as "prior art 1").

Also, as disclosed in Japanese Patent Publication No. 7-120621, a technique for determining the predetermined parameters by executing a fuzzy process based on fuzzy inference using statistical values such as the average value and variance of the measured positions of the alignment marks and obtaining the arrangement coordinate positions of the shot areas has also been proposed (hereafter, this case is referred to as "prior art 2").

When all alignment marks are equally formed, the premise of prior art 1 that "all position measurement results of alignment marks have the same reliability" is true, but not true when the shapes of alignment marks differ depending on their positions on a substrate. Therefore, when the shapes of alignment marks differ depending on their positions on a substrate, all position measurement results, whether their reliabilities are high or low, equally contribute to determination of the arrangement coordinate positions of shot areas their different reliabilities.

The accuracy of the arrangement coordinate position determination of shot areas determined under the above premise suffices to achieve conventionally required exposure accuracy, but does not suffice for the increase of integration degree in recent years.

Prior art 2 is free from any problem of the accuracy of the arrangement coordinate position determination of shot areas unlike in prior art 1. However, since prior art 2 requires a huge computation volume for fuzzy inference, a long period of time is required to determine the arrangement coordinate positions of shot regions, and this makes it difficult to improve the throughput of exposure. In order to prevent such low throughput, a large-scale computation resource is needed. However, the use thereof causes the whole exposure apparatus to be large and complicated.

Upon applying the conventional statistical scheme, the positions of alignment marks to be measured on a wafer are determined empirically or on a trial-and-error basis that after transferring a pattern onto a wafer while aligning the wafer using a temporarily selected sample set, the same patterns on the wafer are measured, and that if desired results are not obtained, another sample set is selected.

As described above, in the conventional method, a sample set of alignment marks as a subset of a set of all alignment marks is determined by an aleatory method, and the validity of determination of that sample set is not quantitatively evaluated. Therefore, it is not guaranteed that the error distribution of the positions of a plurality of alignment marks as elements of a sample set determined by the conventional method appropriately reflects the error distribution of positions of all alignment marks.

For trying to solve this problem, there is the following method: the position control using a plurality of parameters which are obtained using a provisional sample set determined empirically or arbitrarily and uniquely specify the arrangement coordinate positions of shot regions, when the sample set includes shot areas (so-called "isolated shots")

having much larger alignment errors than those of other shot regions, alignment marks contained in such isolated shots are excluded from the sample set. This method presupposes that only few isolated shots exist, and that those alignment marks cause the decrease of alignment accuracy for all shot regions.

However, if alignment marks of two isolated shot regions, of which pattern shift directions are almost opposite to each other (i.e., the two shot areas having negative correlation), are selected, high-accuracy alignment is possible. Therefore, exclusion of the measured position information of alignment marks contained in an isolated shot area may result in an alignment accuracy decrease.

In the case where a wafer is aligned on the basis of the position measurement results of alignment marks included in a subset (sample set) selected from a large number of alignment marks, upon examining the validity of a method for selecting the desired sample set, evaluating separately individual alignment marks in the sample set does not have much sense. This is because it is ideal that the sample set broadly reflects the entire set and because it is preferable that alignment marks in the sample set preferably have a position distribution that corresponds to that of alignment marks in the entire set. For example, in the case where one of five alignment marks in a sample set is an alignment mark contained in an isolated shot region, if one fifth of all the alignment marks are contained in isolated shot regions, the sample set is more valid than a sample set excluding alignment marks of isolated shot regions. That is, position errors of measured alignment marks reflect the position distribution of all the alignment marks somehow, and should not be carelessly ignored. However, there have been no proposals concerning a method for selecting a sample set from the entire set of alignment marks formed on a substrate so as to perform statistically valid position control and alignment on the basis of the position measurement results of alignment marks in the sample set.

Furthermore, although it is not appropriate to exclude alignment marks in descending order of position error amounts in order to reduce the number of sample alignment marks and alignment measurement time, there have been no proposals concerning a method for reducing the number of sample alignment marks while maintaining alignment accuracy.

That is, an alignment technology that can meet recent requirements of improved exposure accuracy and throughput is needed.

SUMMARY OF THE INVENTION

The present invention has been made considering the above situation, and a first object of the present invention is to provide a position detection method and position detector which can accurately and efficiently detect arrangement information of divided areas on an object.

A second object of the present invention is to provide an exposure method and exposure apparatus that can transfer a predetermined pattern onto a substrate with high accuracy.

A third object of the present invention is to provide a device on which fine patterns are accurately formed.

A fourth object of the present invention is to provide a manufacturing method of manufacturing a device on which fine patterns are accurately formed.

According to the first aspect, there is provided a first position detection method for detecting position information of any area on an object provided with a plurality of position-measurement-points, the position detection method comprising a measurement step of selecting more position-measurement-points than a minimum number of measurements required to calculate values of a predetermined number of parameters, which uniquely specify position information of any area on the object, from the plurality of position-measurement-points and measuring pieces of position information of the respective selected position-measurement-points; an estimation step of calculating respective positions of the selected position-measurement-points, based on the measurement results of the pieces of position information, and estimating probability density functions which each represent occurrence probability of the calculated position for respective one of the selected position-measurement-points; a probability density calculation step of calculating probability density of the calculated position of each of the position-measurement-points, based on respective one of the probability density functions; and a parameter calculation step of evaluating an error of each calculated position relative to respective reference position while using the respective calculated probability density's value as a piece of weight information and calculating values of the predetermined number of parameters, based on the evaluated errors.

According to this method, pieces of position information of selected position-measurement-points are measured, and the positions and probability densities of the selected position-measurement-points are calculated on the basis of the measurement results. Upon calculating the statistically most valid values of a predetermined number of parameters, which uniquely specify position information of any area on an object, while using the calculated probability densities as pieces of information each representing the certainty of the position of a respective position-measurement-point, the error between each calculated position and a respective reference position is weighted in accordance with the certainty of the calculated position of the respective position-measurement-point, i.e., the probability density at the calculated position of the respective position-measurement-point. That is, if the probability density is large, the weight is large, and if the probability density is small, the weight is small. As a result, when the calculated position of a position-measurement-point has high certainty, the degree of influence of the error of the calculated position of the position-measurement-point relative to its reference position is high; when the calculated position of a position-measurement-point has low certainty, the degree of influence of the error of the calculated position of the position-measurement-point relative to its reference position is low. Therefore, since statistically valid values of a predetermined number of parameters which uniquely specify position information of any area on an object can be calculated while rationally reflecting respective certainties of the calculated positions of position-measurement-points, the position of a area of interest on the object can be accurately detected.

In the first position detection method of the present invention, the reference positions can be determined in advance on the basis of design information.

The probability density of each calculated mark (a position-measurement-point) position directly reflects the certainty of a respective mark position. Therefore, in the first position detection method of the present invention, the errors are evaluated by multiplying the errors of the calculated positions relative to the respective reference positions by the respective probability densities of the calculated positions.

In the first position detection method of the present invention, normal distributions can be adopted as the probability density functions. In this way, it is particularly valid to presume the occurrence probability distributions to be a normal distribution when variations of errors of the calculated mark positions relative to the respective reference positions are expected to be random like normal random numbers. When the occurrence probability distribution is known, a probability density function of that probability distribution can be used instead of a normal distribution. On the other hand, when the occurrence probability distribution is unknown, it is rational to presume the occurrence probability distribution to be a normal distribution, which is the most general probability distribution.

In the first position detection method of the present invention, position measurement marks can be formed at the position-measurement-points. In such case, the position of each position-measurement-point can be measured by detecting a respective position measurement mark. Note that the position measurement mark can be, e.g., a line-and-space mark, box-in-box mark, and the like.

In this case, a plurality of position detection marks formed at the plurality of position-measurement-points can include a first number of first marks, of which surface states change in a first direction, and the position information of each first mark measured in the measurement step can be position information of a plurality of feature portions in the first direction of each first mark. In such a case, the position of a first mark in the first direction can be calculated by measuring and processing the position information of the first mark. Also, a probability density function that represents the occurrence probability of the calculated position can be estimated based on its design reference position and measured position information. When the first mark periodically changes in the first direction like a line-and-space mark, the average value of positions of a plurality of feature portions in the first direction such as the boundaries between lines and spaces, which represents the central position of the first mark, can be used as the position of the first mark, and the probability density function that represents the occurrence probability of the central position can be estimated.

The position information of each selected first mark can be measured in the measurement step at a plurality of positions in a direction perpendicular to the first direction. In this case, since the number of pieces of position information to be processed increases, the position of the first mark in the first direction can be accurately calculated, and the probability density function that represents the occurrence probability of the calculated position can be accurately estimated.

The surface state of each first mark can also change in a second direction different from the first direction, and the position information of the first mark measured in the measurement step can include position information, in the first direction, of a plurality of feature portions lined in the first direction of the first mark, and position information, in the second direction, of a plurality of feature portions lined in the second direction of the first mark. In this case, the two-dimensional position of the first mark can be calculated based on the measurement result of the position information of the first mark, and the probability density function that represents the occurrence probability of the calculated position can be estimated based on the design reference position and measured position information. That is, information that pertains to the two-dimensional position of the object can be calculated.

In the measurement step, for each selected first mark, at least one of position information in the first direction of a plurality of feature portions in the first direction and position information in the second direction of a plurality of feature portions in the second direction can be measured. In this case, since the number of pieces of position information to be processed increases for at least one of the first and second directions, the position of the first mark in a direction in which the number of pieces of position information to be processes has increased can be accurately calculated, and the probability density function that represents the occurrence probability of the calculated position can be accurately estimated.

The plurality of marks can further include a second number of second marks, of which surface states change in a second direction different from the first direction, and the position information of each second mark measured in the measurement step can be position information of a plurality of feature portions in the second direction of the second mark. In this case, the position of the second mark in the second direction can be calculated by measuring and processing position information of the second mark in the same manner as for the first mark, and a probability density function that represents the occurrence probability of the calculated position can be estimated based on its design reference position and measured position information. That is, information that pertains to a two-dimensional position of the object can be calculated.

In the measurement step, the position information of each selected second mark can be measured at a plurality of positions in a direction perpendicular to the second direction. In this case, since the number of pieces of position information to be processed increases, the position of the second mark in the second direction can be accurately calculated, and the probability density function that represents the occurrence probability of the calculated position can be accurately estimated.

Furthermore, in the first position detection method of the present invention in which position measurement marks are formed at position-measurement-points, a plurality of divided areas can be arranged on an object, and position measurement marks can be contained in each of the plurality of divided areas. In this case, the arrangement coordinate position of each divided area on the object can be accurately detected.

In addition, the predetermined number of parameters can include parameters associated with representative points of the plurality of divided areas. In this case, the arrangement of the representative points, e.g. the central points, of the plurality of divided areas on the object can be calculated, the arrangement being referred to as an arrangement coordinate system.

Note that the predetermined number of parameters can further include parameters associated with points other than the representative points of the plurality of divided areas. In this case, in addition to the arrangement coordinate system of representative points of the plurality of divided areas on the object, a divided area coordinate system that specifies the direction of pattern transfer, scale, and the like on the divided areas can be calculated.

According to the second aspect, there is provided a second position detection method for detecting position information of any area on an object provided with a first number of position-measurement-points, the position detection method comprising a first step of selecting a plurality of measurement point subsets which each consist of a third number of position-measurement-points and are different from one another, the third number being larger than a second number and smaller than the first number, the second number being a minimum number of measurement points required to calculate a predetermined number of parameters that uniquely specify position information of any area on the object; and a second step of statistically calculating, for each of the plurality of measurement point subsets, estimations of the predetermined number of parameters and certainty of the estimations, based on measurement results of the third number of position-measurement-points. For each measurement point subset, the certainty of the estimations of the predetermined number of parameters is calculated using the calculated estimations, and is determined in accordance with position errors of position-measurement-points, which are used to calculate the estimations, relative to respective expected positions. If the deviation of position errors of the position-measurement-points used to calculate the estimations is large, the certainty is low; if the deviation of the position errors is small, the certainty is high.

According to this method, a plurality of different measurement point subsets are selected, and for each of the measurement point subsets, estimations and their certainty of the predetermined number of parameters which uniquely specify position information of any area on an object are statistically calculated. The estimations and their certainty of the predetermined number of parameters (to be also referred to as "position parameters" hereinafter) of each measurement point subset reflect the position distribution of all position-measurement-points. Therefore, the position distribution of all position-measurement-points can be accurately estimated based on respective groups of the estimations and their certainty of the predetermined number of parameters for the plurality of measurement point subsets that are selected empirically or arbitrarily.

The second position detection method can further comprise the third step of obtaining statistically valid values of the predetermined number of parameters, based on the respective groups of estimations and certainty for the plurality of measurement point subsets calculated in the second step. In this case, since statistically valid position parameter values are calculated on the basis of respective groups of the estimations and their certainty of position parameters for the measurement point subsets, and the groups of the estimations and certainty each statistically reflect the predetermined number of parameters that are statistically determined by broadly sampling from all position-measurement-points, statistically valid values of the predetermined number of parameters for all the position-measurement-points can be accurately calculated.

Furthermore, the statistically valid value of each of the predetermined number of parameters is obtained by calculating average of the corresponding estimations weighted with respective certainties, each of the certainties representing a piece of weight information for the respective estimation. In this case, since the weighted mean of estimations is calculated using the respective certainties of the estimations as respective weights of the estimations, the rational evaluation of the estimations can be performed in which estimations with a low certainty contribute less, and in which other estimations with a high certainty contribute more. And statistically valid values of the predetermined number of parameters for all the position-measurement-points can be accurately and easily calculated.

In the second position detection method of the present invention, in the second step, certainties of position measurement results of the position-measurement-points can be taken in account for calculating the estimations and certainty thereof. In this case, since the estimations and their certainty of the predetermined number of parameters are calculated considering the certainties of the position measurement results at the position-measurement-points, statistically more valid values of the predetermined number of parameters can be calculated.

In addition, the second step can comprise an estimation step of calculating, for each of the plurality of measurement point subsets, respective positions of the third number of position-measurement-points based on measurement results of the third number of position-measurement-points and estimating probability density functions that each represent occurrence probability of the calculated position of the respective, selected position-measurement-point; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors. In this case, since errors between the calculated positions and respective reference positions are weighted in accordance with the information of the certainties of the calculated positions of the position-measurement-points, i.e. the probability densities at the calculated positions of the position-measurement-points, statistically valid estimations of the predetermined number of parameters can be calculated which uniquely specify position information of any area on an object and rationally reflect the certainties of the calculated positions of the position-measurement-points.

In the second position detection method of the present invention, position measurement marks can be formed at the position-measurement-points as in the first position detection method of the present invention. And, a plurality of divided areas can be arranged on the object, and position measurement marks can be contained in each of the plurality of divided areas.

According to the third aspect, there is provided a third position detection method for detecting position information of any area on an object provided with a first number of position-measurement-points, the position detection method comprising a first step of selecting a first measurement point subset which consists of a third number of position-measurement-points, the third number being larger than a second number and smaller than the first number, the second number being a minimum number of measurement points required to calculate a predetermined number of parameters that uniquely specify position information of any area on the object; a second step of selecting a plurality of second measurement point subsets which each consist of a fourth number of position-measurement-points and are different from one another, the fourth number being larger than the second number and smaller than the third number; and a third step of statistically evaluating possibility of replacing the first measurement point subset by one of the plurality of second measurement point subsets, based on measurement results of the third number of position-measurement-points composing the first measurement point subset and measurement results of sets of the fourth number of position-measurement-points each composing one of the second measurement point subsets, the first measurement point subset being used to calculate the predetermined number of parameters.

According to this, for each of the plurality of second measurement point subsets, it is evaluated whether or not it is possible to replace the initially selected sample set (first measurement point subset) by a sample set including a smaller number of elements. That is, to determine whether or not it is possible to reduce the number of position-measurement-points used to calculate the predetermined number of parameters, it is evaluated, based on the position measurement results at the position-measurement-points of the first measurement point subset and those of each second measurement point subset, whether or not the position error distribution of position-measurement-points in the second measurement point subset is similar to that of position-measurement-points of the first measurement point subset, in other words, whether or not the second measurement point subset and the first measurement point subset equally reflect the entire set of all position-measurement-points. Therefore, upon reducing the number of position-measurement-points as elements of a sample set, statistical validity of the calculated values of the predetermined number of parameters can be maintained.

In the third position detection method of the present invention, the third step can comprise a fourth step of statistically calculating estimations of the predetermined number of parameters and certainty of the estimations, based on measurement results of the third number of position-measurement-points composing the first measurement point subset; a fifth step of statistically calculating estimations of the predetermined number of parameters and certainty of the estimations for each of the plurality of second measurement point subsets, based on measurement results of the fourth number of position-measurement-points; and a sixth step of comparing the estimations and certainty of the first measurement point subset with the estimations and certainty for each of the plurality of second measurement point subsets and evaluating possibility of replacing the first measurement point subset by one of the plurality of second measurement point subsets, the first measurement point subset being used to calculate the predetermined number of parameters.

In this case, the estimations and their certainty of the predetermined number of parameters calculated based on the position measurement results at the position-measurement-points of the first measurement point subset are compared with those calculated based on the position measurement results at the position-measurement-points of each second measurement point subset. In this comparison, the certainties of respective groups of the estimations of the two measurement point subsets are compared as well as the groups of the estimations, the certainties each reflecting deviation of the position error distribution of position-measurement-points of the respective measurement point subset. And by examining the two comparison results, the position error distribution of position-measurement-points of the first measurement point subset is compared with that of position-measurement-points of the second measurement point subset. Therefore, it can be determined whether or not one of the plurality of second measurement point subsets and the first measurement point subset equally reflect the entire set of all position-measurement-points.

Furthermore, in the fourth step, certainties of position measurement results of the position-measurement-points can be taken in account for calculating the estimations and certainty thereof. In this case, since the estimations and their certainty of the predetermined number of parameters are calculated considering the certainties of the position measurement results at the position-measurement-points, statistically more valid values of the predetermined number of parameters can be calculated.

Additionally, the fourth step can comprise an estimation step of calculating respective positions of the third number of position-measurement-points, which compose the first measurement point subset, based on measurement results of the third number of position-measurement-points and estimating probability density functions that each represent occurrence probability of the calculated position of a respective point of the third number of position-measurement-points; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors. In this case, since, for the third number of position-measurement-points composing the first measurement point subset, errors between the calculated positions and their reference positions are weighted in accordance with the information of the certainties of the calculated positions of the position-measurement-points, i.e. the probability densities at the calculated positions of the position-measurement-points, statistically valid estimations of the predetermined number of parameters can be calculated which uniquely specify position information of any area on an object and rationally reflect the certainties of the calculated positions of the position-measurement-points.

In addition, in the fifth step, certainties of position measurement results of the position-measurement-points can be taken into account upon calculating the estimations and certainty thereof. Moreover, the fifth step can comprise an estimation step of calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points; a probability density calculation step of calculating respective probability densities of the calculated positions of the position-measurement-points, based on the probability density functions; and a parameter calculation steep of evaluating an error of each of the calculated positions relative to respective reference position using the respective calculated probability density's value as a piece of weight information and calculating estimations of the predetermined number of parameters, based on the evaluated errors.

In addition, in the third position detection method according to this invention, the third step can comprise a fourth step of statistically calculating, for each of the second measurement point subsets, estimations of the predetermined number of parameters and certainty of the estimations, based on measurement results of the fourth number of position-measurement-points; a fifth step of statistically calculating position errors of the position-measurement-points of the first measurement point subset through use of the estimations of the predetermined number of parameters calculated in the fourth step and evaluating possibility of replacing the first measurement point subset by one of the plurality of second measurement point subsets.

In this case, by calculating position errors of position-measurement-points composing the first measurement point subset by using the estimations, of the predetermined number of parameters, calculated on the basis of the position measurement results at the position-measurement-points of each second measurement point subset, the position error distribution of position-measurement-points in the first measurement point subset can be obtained. Therefore, without calculating the estimations and their certainty of the predetermined number of parameters on the basis of the position measurement results at the position-measurement-points of the first measurement point subset, it can be determined whether or not one of the plurality of second measurement point subsets and the first measurement point subset equally reflect the entire set of all position-measurement-points.

Especially, in the case where a second measurement point subset to be compared is a subset of the first measurement point subset, by calculating position errors of position-measurement-points which are included in the first measurement point subset but not included in the second measurement point subset, the estimations and their certainty of the predetermined number of parameters can be calculated for the case where the first measurement point subset is used as a sample set. Therefore, it can be quickly determined whether or not one of the plurality of second measurement point subsets and the first measurement point subset equally reflect the entire set of all position-measurement-points.

Furthermore, in the fourth step, certainties of position measurement results of the position-measurement-points can be taken in account for calculating the estimations and certainty thereof. In this case, since the estimations and their certainty of the predetermined number of parameters are calculated considering the certainties of the position measurement results at the position-measurement-points, statistically more valid values of the predetermined number of parameters can be calculated.

In addition, the fourth step can comprise an estimation step of calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors. In this case, since, for each of the second measurement point subsets, errors between the calculated positions and their reference positions are weighted in accordance with the information of the certainties of the calculated positions of the position-measurement-points, i.e. the probability densities at the calculated positions of the position-measurement-points, statistically valid estimations of the predetermined number of parameters can be calculated which uniquely specify position information of any area on an object and rationally reflect the certainties of the calculated positions of the position-measurement-points.

Furthermore, the third position detection method according to this invention can further comprise the fourth step which, if the third step finds second measurement point subsets that can replace the first measurement point subset, selects the most valid, second measurement point subset for replacement and adopts estimations of the predetermined number of parameters, calculated based on measurement results of the fourth number of position-measurement-points of the selected second measurement point subset, as values thereof, and which, if the third step finds no second measurement point subsets that can replace the first measurement point subset, adopts estimations of the predetermined number of parameters, calculated based on measurement results of the second number of position-measurement-points of the first measurement point subset, as values thereof.

In this case, if the third step finds second measurement point subsets that can replace the first measurement point subset, i.e. if the number of position-measurement-points can be reduced maintaining the statistical validity, the most valid, second measurement point subset for replacement is adopted as the sample set. On the other hand, if the third step finds no second measurement point subsets that can replace the first measurement point subset, i.e. if the number of position-measurement-points can not be reduced maintaining the statistical validity, the first measurement point subset is adopted as the sample set. Then, the estimations of the predetermined number of parameters calculated based on the position measurement results at the position-measurement-points of the sample set are adopted as the values of the predetermined number of parameters. Therefore, the number of position-measurement-points used to calculate the values of the predetermined number of parameters can be reduced while maintaining the statistical validity, and improvement of the position detection speed can be achieved maintaining the accuracy.

In the third position detection method according to this invention, position measurement marks can be formed at the position-measurement-points in the same manner as in the first position detection method, and a plurality of divided areas, each of which is provided with the position measurement marks, can be arranged on the object.

According to the fourth aspect of this invention, there is provided a fourth position detection method for detecting position information of any area on an object provided with a first number of position-measurement-points, the position detection method comprising a first step of selecting a plurality of first measurement point subsets which each consist of a third number of position-measurement-points and are different from one another, the third number being larger than a second number and smaller than the first number, the second number being a minimum number of measurement points required to calculate a predetermined number of parameters that uniquely specify position information of any area on the object; a second step of selecting a plurality of second measurement point subsets which each consist of a fourth number of position-measurement-points and are different from one another, the fourth number being larger than the second number and smaller than the third number; and a third step of statistically evaluating possibility of replacing the plurality of first measurement point subsets by one of the plurality of second measurement point subsets, as a measurement point set used to calculate the predetermined number of parameters.

According to this method, for each of the plurality of second measurement point subsets, it is evaluated whether or not it is possible to replace the plurality of initially selected sample sets (the plurality of first measurement point subsets) by one sample set composed of a fewer number of elements. That is, to determine whether or not the number of position-measurement-points used to calculate values of the predetermined number of parameters and the processing volume of the position measurement results can be reduced, it is evaluated whether or not the position error distribution of position-measurement-points in one of the plurality of second measurement point subsets is similar to a position error distribution, for all position-measurement-points, estimated based on the position measurement results at the position-measurement-points of the plurality of first measurement point subsets. Therefore, upon reducing the number of position-measurement-points as elements of a sample set and reducing the processing volume of the position measurement results, statistical validity of the calculated values of the predetermined number of parameters can be maintained.

In the fourth position detection method according to this invention, the third step can comprise a fourth step of statistically calculating, for each of the plurality of first measurement point subsets, estimations of the predetermined number of parameters and certainty of the estimations, based on measurement results of the third number of position-measurement-points; a fifth step of calculating statistically valid estimations of the predetermined number of parameters and certainty of the estimations, based on groups of the estimations and certainty thereof for the plurality of first measurement point subsets, calculated in the fourth step; a sixth step of statistically calculating estimations of the predetermined number of parameters and certainty of the estimations for each of the plurality of second measurement point subsets, based on measurement results of the fourth number of position-measurement-points; and a seventh step of comparing the statistically valid estimations and certainty with the estimations and certainty for each of the plurality of second measurement point subsets and evaluating possibility of adopting one of the plurality of second measurement point subsets as a measurement point set used to calculate the predetermined number of parameters.

In this case, the statistically valid estimations and their certainty of the predetermined number of parameters calculated based on the position measurement results at the position-measurement-points of the plurality of first measurement point subsets are compared with the estimations and their certainty of the predetermined number of parameters calculated based on the position measurement results at the position-measurement-points of each second measurement point subset. In this comparison, the certainties of the two groups of the estimations are compared as well as the groups of the estimations, the certainties each reflecting deviation of the position error distribution of position-measurement-points of the respective measurement point subset. And by examining the two comparison results, the two position error distributions are compared. Therefore, it can be determined whether or not one of the plurality of second measurement point subsets and the first measurement point subset equally reflect the entire set of all position-measurement-points.

Furthermore, in the fourth step, certainties of position measurement results of the position-measurement-points can be taken in account for calculating the estimations and certainty thereof. In this case, since the estimations and their certainty of the predetermined number of parameters are calculated considering the certainties of the position measurement results at the position-measurement-points, statistically more valid values of the predetermined number of parameters can be calculated.

Furthermore, the fourth step can comprise an estimation step of calculating respective positions of the third number of position-measurement-points, for each of the plurality of first measurement point subsets, based on measurement results of the third number of position-measurement-points and estimating probability density functions that each represent occurrence probability of the calculated position of a respective point of the third number of position-measurement-points; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors. In this case, since, for each of the first measurement point subsets, errors between the calculated positions and their reference positions are weighted in accordance with the information of the certainties of the calculated positions of the position-measurement-points, i.e. the probability densities at the calculated positions of the position-measurement-points, statistically valid estimations of the predetermined number of parameters can be calculated which uniquely specify position information of any area on an object and rationally reflect the certainties of the calculated positions of the position-measurement-points.

In addition, in the sixth step, certainties of position measurement results of the position-measurement-points can be taken into account upon calculating the estimations and certainty thereof. And the sixth step can comprise an estimation step of calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors.

Furthermore, the fourth position detection method can further comprise the eighth step which, if the third step finds second measurement point subsets that can replace the first measurement point subset, selects the most valid, second measurement point subset for replacement and adopts estimations of the predetermined number of parameters, calculated based on measurement results of the fourth number of position-measurement-points of the selected second measurement point subset, as values thereof, and which, if the third step finds no second measurement point subsets that can replace the first measurement point subset, adopts the statistically valid estimations as values of the predetermined number of parameters. Therefore, the number of position-measurement-points used to calculate the values of the predetermined number of parameters can be reduced while maintaining the statistical validity, and improvement of the position detection speed can be achieved maintaining the accuracy.

In addition, in the fourth position detection method, the third step can comprise a fourth step of statistically calculating, for each of the second measurement point subsets, estimations of the predetermined number of parameters and certainty of the estimations, based on measurement results of the fourth number of position-measurement-points; a fifth step of calculating position errors of all the position-measurement-points of the plurality of first measurement point subsets through use of the estimations of the predetermined number of parameters calculated for each of the second measurement point subsets and evaluating possibility of replacing the plurality of first measurement point subsets by one of the plurality of second measurement point subsets.

In this case, by calculating position errors of position-measurement-points of the plurality of first measurement point subsets by using the estimations, of the predetermined number of parameters, calculated based on the position measurement results at the position-measurement-points of each second measurement point subset, the position error distribution for all position-measurement-points, which will be estimated if the plurality of first measurement point subsets serve as the sample set, can be obtained. Therefore, without calculating groups of the estimations and their certainty of the predetermined number of parameters on the basis of the position measurement results at the position-measurement-points of the plurality of first measurement point subsets and thus the statistically valid estimations and their certainty of the predetermined number of parameters, it can be determined whether or not one of the plurality of second measurement point subsets reflects the entire set of all position-measurement-points.

Furthermore, in the fourth step, certainties of position measurement results of the position-measurement-points can be taken in account for calculating the estimations and certainty thereof. In this case, since the estimations and their certainty of the predetermined number of parameters are calculated considering the certainties of the position measurement results at the position-measurement-points, statistically more valid values of the predetermined number of parameters can be calculated.

Furthermore, the fourth step can comprise an estimation step of calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position measurement-points; a probability density calculation step of calculating respective probability densities of the calculated positions of the position-measurement-points, based on the probability density functions; and a parameter calculation step of evaluating an error of each of the calculated positions relative to respective reference position using the respective calculated probability density's value as a piece of weight information and calculating estimations of the predetermined number of parameters, based on the evaluated errors. In this case, since, for each of the second measurement point subsets, errors between the calculated positions and their reference positions are weighted in accordance with the information of the certainties of the calculated positions of the position-measurement-points, i.e. the probability densities at the calculated positions of the position-measurement-points, statistically valid estimations of the predetermined number of parameters can be calculated which uniquely specify position information of any area on an object and rationally reflect the certainties of the calculated positions of the position-measurement-points.

In addition, the fourth position detection method according to this invention can further comprise the fourth step which, if the third step finds second measurement point subsets that can replace the first measurement point subset, selects the most valid one, for replacement, of the second measurement point subsets and adopts estimations of the predetermined number of parameters, calculated based on measurement results of the fourth number of position-measurement-points of the selected second measurement point subset, as values thereof, and which, if the third step finds no second measurement point subsets that can replace the first measurement point subset, statistically calculates estimations of the predetermined number of parameters and certainty of the estimations, based on measurement results of the third number of position-measurement-points for each of the plurality of first measurement point subsets; and adopts as values of the predetermined number of parameters statistically valid estimations thereof calculated based on groups of the estimations and certainty thereof for the plurality of first measurement point subsets. Therefore, the number of position-measurement-points used to calculate the values of the predetermined number of parameters can be reduced while maintaining the statistical validity, and improvement of the position detection speed can be achieved maintaining the accuracy.

Note that in the fourth position detection method of this invention, in the same manner as in the second position detection method, the statistically valid value of each of the predetermined number of parameters can be obtained by calculating average of the corresponding estimations weighted with the respective certainties, each of the certainties representing a piece of weight information for the respective estimation.

Furthermore, in the fourth position detection method of this invention, position measurement marks can be formed at the position-measurement-points in the same manner as in the first position detection method. And a plurality of divided areas each of which is provided with the position measurement marks can be arranged on the object.

According to the fifth aspect of this invention, there is provided a first position detector that detects position information of any area on an object provided with a plurality of position-measurement-points, the position detector comprising a measurement unit that measures pieces of position information of more position-measurement-points than a minimum number of measurements required to calculate values of a predetermined number of parameters, which uniquely specify position information of any area on the object, the position-measurement-points being selected from the plurality of position-measurement-points; an estimation unit that is electrically connected to the measurement unit and that detects respective positions of the selected position-measurement-points, based on the measurement results of the pieces of position information, estimates probability density functions which each represent occurrence probability of the detected position for respective one of the selected position-measurement-points, and calculates probability density of the detected position of each of the position-measurement-points; and a parameter calculation unit that is electrically connected to the measurement unit and the estimation unit and that evaluates detection error of each of the detected positions while using the respective calculated probability density's value as a piece of weight information and calculates such values of the predetermined number of parameters that the detection errors become statistically minimum as a whole, based on the detection errors.

In this detector, according to the first position detection method of the present invention, the estimation unit calculates the positions of the selected marks (position-measurement-points) and respective probability densities at the calculated mark positions on the basis of position information of the marks measured by the measurement unit. And the parameter calculation unit calculates the values of the predetermined number of parameters that uniquely specify position information of any area on an object. Therefore, the predetermined number of parameters can be accurately calculated, and the position information of any area on an object can be accurately detected.

In the first position detector of the present invention, the measurement unit can comprise an image pickup unit for picking up images of marks formed on the object. In this case, the position information of a selected mark can be measured on the basis of changes in light intensity according to position in the picked-up mark image.

According to the sixth aspect, there is provided a second position detector that detects position information of any area on an object provided with a first number of position-measurement-points, the position detector comprising a measurement unit that measures positions of the position-measurement-points; a set-selection unit that selects a plurality of measurement point subsets which each consist of a third number of position-measurement-points and are different from one another, the third number being larger than a second number and smaller than the first number, the second number being a minimum number of measurement points required to calculate a predetermined number of parameters that uniquely specify position information of any area on the object; and an estimation computing unit that is electrically connected to the measurement unit and the set-selection unit and that statistically calculates, for each of the plurality of measurement point subsets, estimations of the predetermined number of parameters and certainty of the estimations, based on measurement results of the third number of position-measurement-points.

In this detector, for each measurement point subset selected by the set selection unit, according to the second position detection method of the present invention, the estimation computing unit statistically estimates values of the predetermined number of parameters which uniquely specify position information of any area on an object and calculates the certainty of the estimations on the basis of the positions of position-measurement-points measured by the measurement unit. Therefore, the position distribution of all position-measurement-points can be accurately estimated based on respective groups of the estimations and their certainty of the predetermined number of parameters for the plurality of measurement point subsets that are selected empirically or arbitrarily.

In the second position detector according to this invention, the estimation computing unit can comprise an estimation unit that, for each of the plurality of measurement point subsets, detects respective positions of the third number of position-measurement-points, based on the measurement results of the pieces of position information of the third number of position-measurement-points, estimates probability density functions which each represent occurrence probability of the detected position for the respective point of the third number of position-measurement-points, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors. In this case, for each of the plurality of measurement point subset, the parameter calculation unit weights errors between the calculated positions and their reference positions in accordance with the information of the certainties of the calculated positions of the position-measurement-points calculated by the estimation unit, i.e. the probability densities at the calculated positions of the position-measurement-points, and calculates estimations of the predetermined number of parameters which uniquely specify position information of any area on an object and rationally reflect the certainties of the calculated positions of the position-measurement-points. Therefore, statistically valid estimations of the predetermined number of parameters can be obtained.

In addition, the second position detector according to this invention can further comprise a parameter value determining unit that is electrically connected to the estimation computing unit and that calculates statistically valid estimations of the predetermined number of parameters based on groups of the estimations and certainty thereof, calculated by the estimation computing unit, for the plurality of measurement point subsets. In this case, the statistically valid values of the predetermined number of parameters for all position-measurement-points can be accurately obtained.

According to the seventh aspect of this invention, there is provided a third position detector that detects position information of any area on an object provided with a first number of position-measurement-points, the position detector comprising a measurement unit that measures positions of the position-measurement-points; a set-selection unit that selects a first measurement point subsets, which each consist of a third number of position-measurement-points, and a plurality of second measurement point subsets which each consist of a fourth number of position-measurement-points and are different from one another, the third number being larger than a second number and smaller than the first number, the second number being a minimum number of measurement points required to calculate a predetermined number of parameters that uniquely specify position information of any area on the object, the fourth number being larger than the second number and smaller than the third number; and an evaluation computing unit that is electrically connected to the set-selection unit and that evaluates possibility of replacing the first measurement point subset by one of the plurality of second measurement point subsets, the first measurement point subset being used to calculate the predetermined number of parameters.

In this detector, according to the third position detection method of this invention, the evaluation computing unit statistically evaluates based on positions of position-measurement-points measured by the measurement unit whether or not it is possible to replace the first measurement point subset as a sample set composed of position-measurement-points to be measured to calculate values of the predetermined number of parameters by one of the plurality of second measurement point subsets each of which is composed of a fewer number of elements than the first measurement point subset. Therefore, upon reducing the number of position-measurement-points as elements of a sample set, statistical validity of the calculated values of the predetermined number of parameters can be maintained.

In the position detector according to this invention, the evaluation computing unit can comprise an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the first measurement point subset and the plurality of second measurement point subsets; and an evaluation unit that is electrically connected to the estimation calculation unit and that compares the estimations and certainty of the first measurement point subset with the estimations and certainty for each of the plurality of second measurement point subsets and evaluates possibility of replacing the first measurement point subset by one of the plurality of second measurement point subsets, the first measurement point subset being used to calculate the predetermined number of parameters.

In this case, the evaluation unit compares the estimations and their certainty of the predetermined number of parameters calculated by the estimation computing unit for the first measurement point subset with those calculated for each second measurement point subset. In this comparison, the certainties of respective groups of the estimations of the two measurement point subsets are compared as well as the groups of the estimations, the certainties each reflecting deviation of the position error distribution of position-measurement-points of the respective measurement point subset. And by examining the two comparison results, the position error distribution of position-measurement-points of the first measurement point subset is compared with that of position-measurement-points of the second measurement point subset. Therefore, it can be determined whether or not one of the plurality of second measurement point subsets and the first measurement point subset equally reflect the entire set of all position-measurement-points.

Furthermore, the estimation calculation unit can comprise an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors. In this case, since, for the specific measurement point subset, the parameter calculation unit weights errors between the calculated positions and their reference positions in accordance with the information of the certainties of the calculated positions of the position-measurement-points, i.e. the probability densities at the calculated positions of the position-measurement-points, and calculates statistically valid estimations of the predetermined number of parameters which uniquely specify position information of any area on an object. Therefore, statistically valid estimations of the predetermined number of parameters that rationally reflect the certainties of the calculated positions of the position-measurement-points can be obtained.

In the third position detector according to this invention, the evaluation computing unit can comprise an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset, which is selected from the plurality of second measurement point subsets; an evaluation unit that is electrically connected to the estimation calculation unit and that calculates position errors of the position-measurement-points, composing the first measurement point subset, through use of estimations of the predetermined number of parameters for each of the polarity of second measurement point subsets and evaluates possibility of replacing the first measurement point subset by one of the plurality of second measurement point subsets.

In this case, by the evaluation unit calculating position errors of position-measurement-points composing in the first measurement point subset by using the estimations, calculated by the estimation computing unit, of the predetermined number of parameters for the second measurement point subset, the position error distribution of position-measurement-points in the first measurement point subset can be obtained. Therefore, without calculating the estimations and their certainty of the predetermined number of parameters on the basis of the position measurement results at the position-measurement-points of the first measurement point subset, it can be determined whether or not one of the plurality of second measurement point subsets and the first measurement point subset equally reflect the entire set of all position-measurement-points.

In addition, the estimation calculation unit can comprise an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors. In this case, since, for the specific measurement point subset, the parameter calculation unit weights errors between the calculated positions and their reference positions in accordance with the information of the certainties of the calculated positions of the position-measurement-points, i.e. the probability densities at the calculated positions of the position-measurement-points, and calculates statistically valid estimations of the predetermined number of parameters which uniquely specify position information of any area on an object. Therefore, statistically valid estimations of the predetermined number of parameters that rationally reflect the certainties of the calculated positions of the position-measurement-points can be obtained.

Furthermore, the third position detector according to this invention can further comprise a parameter value determining unit that is electrically connected to the evaluation computing unit and that calculates values of the predetermined number of parameters, based on evaluation results of the evaluation computing unit. Therefore, the number of position-measurement-points used to calculate the values of the predetermined number of parameters can be reduced while maintaining the statistical validity, and improvement of the position detection speed can be achieved maintaining the accuracy.

According to the eighth aspect of this invention, there is provided a fourth position detector that detects position information of any area on an object provided with a first number of position-measurement-points, the position detector comprising a measurement unit that measures positions of the position-measurement-points; a set-selection unit that selects a plurality of first measurement point subsets, which each consist of a third number of position-measurement-points and are different from one another, and a plurality of second measurement point subsets which each consist of a fourth number of position-measurement-points and are different from one another, the third number being larger than a second number and smaller than the first number, the second number being a minimum number of measurement points required to calculate a predetermined number of parameters that uniquely specify position information of any area on the object, the fourth number being larger than the second number and smaller than the third number; and an evaluation computing unit that is electrically connected to the set-selection unit and that evaluates possibility of adopting one of the plurality of second measurement point subsets as a measurement point subset to calculate the predetermined number of parameters.

In this detector, according to the fourth position detection method of this invention, the evaluation computing unit statistically evaluates based on positions of position-measurement-points measured by the measurement unit whether or not it is possible to replace the plurality of first measurement point subset as a sample set composed of position-measurement-points to be measured to calculate values of the predetermined number of parameters by one of the plurality of second measurement point subsets each of which is composed of a fewer number of elements than the first measurement point subset. Therefore, upon reducing the number of position-measurement-points as elements of a sample set, statistical validity of the calculated values of the predetermined number of parameters can be maintained.

In the fourth position detector according to this invention, the evaluation computing unit can comprise an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the plurality of first measurement point subset and the plurality of second measurement point subsets, and calculates statistically valid estimations of the predetermined number of parameters and certainty of the estimations, based on groups of estimations of the predetermined number of parameters and certainty of the estimations for the plurality of first measurement point subsets; an evaluation computing unit that is electrically connected to the estimation calculation unit and that compares the statistically valid estimations and certainty of the first measurement point subset with the estimations and certainty for each of the plurality of second measurement point subsets, and evaluates possibility of adopting one of the plurality of second measurement point subsets as a measurement point subset to calculate the predetermined number of parameters.

In this case, the evaluation unit calculates the statistically valid estimations and their certainty of the predetermined number of parameters based on sets of the predetermined number of parameters, for the plurality of first measurement point subsets, calculated by the estimation calculation unit, and compares the statistically valid estimations and their certainty of the predetermined number of parameters, for each second measurement point subset, calculated by the estimation calculation unit with the statistically valid estimations and their certainty of the predetermined number of parameters. In this comparison, the certainties of the two groups of the estimations are compared as well as the groups of the estimations, the certainties each reflecting deviation of the position error distribution of position-measurement-points of the respective measurement point subset. And by examining the two comparison results, the two position error distributions are compared. Therefore, it can be determined whether or not one of the plurality of second measurement point subsets and the first measurement point subset equally reflect the entire set of all position-measurement-points.

Furthermore, the estimation calculation unit can comprise an estimation unit that is electrically connected to the measurement unit and that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors. In this case, since, for the specific measurement point subset, the parameter calculation unit weights errors between the calculated positions and their reference positions in accordance with the information of the certainties of the calculated positions of the position-measurement-points, i.e. the probability densities at the calculated positions of the position-measurement-points, and calculates statistically valid estimations of the predetermined number of parameters which uniquely specify position information of any area on an object. Therefore, statistically valid estimations of the predetermined number of parameters that rationally reflect the certainties of the calculated positions of the position-measurement-points can be obtained.

In the fourth position detector according to this invention, the evaluation computing unit can comprise an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the plurality of second measurement point subsets; and an evaluation unit that is electrically connected to the estimation calculation unit and that calculates errors of all the position-measurement-points of the plurality of first measurement point subsets through use of the estimations of the predetermined number of parameters-calculated for each of the second measurement point subsets, and evaluates possibility of replacing the plurality of first measurement point subsets by one of the plurality of second measurement point subsets.

In this case, by the evaluation unit calculating position errors of position-measurement-points of the plurality of first measurement point subsets by using the estimations, of the predetermined number of parameters for each second measurement point subset, calculated by the estimation calculation unit, the position error distribution for all position-measurement-points, which will be estimated if the plurality of first measurement point subsets serve as the sample set, can be obtained. Therefore, without calculating groups of the estimations and their certainty of the predetermined number of parameters on the basis of the position measurement results at the position-measurement-points of the plurality of first measurement point subsets and thus the statistically valid estimations and their certainty of the predetermined number of parameters, it can be determined whether or not one of the plurality of second measurement point subsets reflects the entire set of all position-measurement-points.

In addition, the estimation calculation unit can comprise an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as apiece of weight information and calculates such values of the predetermined number of parameters that the detection errors become statistically minimum as a whole, based on the detection errors. In this case, since, for the specific measurement point subset, the parameter calculation unit weights errors between the calculated positions and their reference positions in accordance with the information of the certainties of the calculated positions of the position-measurement-points, i.e. the probability densities at the calculated positions of the position-measurement-points, and calculates statistically valid estimations of the predetermined number of parameters which uniquely specify position information of any area on an object. Therefore, statistically valid estimations of the predetermined number of parameters that rationally reflect the certainties of the calculated positions of the position-measurement-points can be obtained.

The fourth position detector according to this invention can further comprise a parameter value determining unit that is electrically connected to the parameter calculation unit and that calculates values of the predetermined number of parameters, based on evaluation results of the evaluation computing unit. Therefore, the number of position-measurement-points used to calculate the values of the predetermined number of parameters can be reduced while maintaining the statistical validity, and improvement of the position detection speed can be achieved maintaining the accuracy.

According to the ninth aspect of this invention, there is provided an exposure method for transferring a predetermined pattern onto divided areas on a substrate, comprising an arrangement information calculation step of calculating a predetermined number of parameters that pertain to positions of the divided areas by a position detection method according to this invention and calculating arrangement information of the divided areas on the substrate; and a transfer step of transferring the pattern onto the divided areas while aligning the substrate based on the arrangement information of the divided areas calculated in the arrangement information calculation step.

According to this method, a pattern is transferred onto divided areas while accurately detecting the arrangement of the divided areas on a substrate using a detection method of the present invention and aligning the substrate on the basis of the detection results. Therefore, a pattern can be accurately transferred onto the divided areas.

According to the tenth aspect of this invention, there is provided an exposure apparatus that transfers a predetermined pattern onto divided areas on a substrate, comprising a stage unit that moves the substrate along a movement plane; and a position detector according to this invention that calculates arrangement information of the divided areas on the substrate mounted on the stage unit.

This apparatus transfers a pattern onto divided areas while moving and aligning the substrate through the stage unit on the basis of arrangement of the divided areas detected by the position detection unit of this invention. Therefore, a pattern can be accurately transferred onto the divided areas.

In addition, in a lithography process, by performing exposure using an exposure apparatus according to the present invention, it is possible to form a multi-layer pattern on a substrate with high accuracy of superposition, and therefore it is possible to manufacture a more highly integrated micro device with high yield, and the productivity can be improved. Accordingly, another aspect of the present invention is a device manufactured by using an exposure apparatus of the present invention and a method of manufacturing a device using an exposure method of the present invention.

DESCRIPTION OF THE PREFERRED EMBODIMENTS

An embodiment of the present invention will be described hereinafter with reference to FIGS. 1 to 12.

Figure 1:
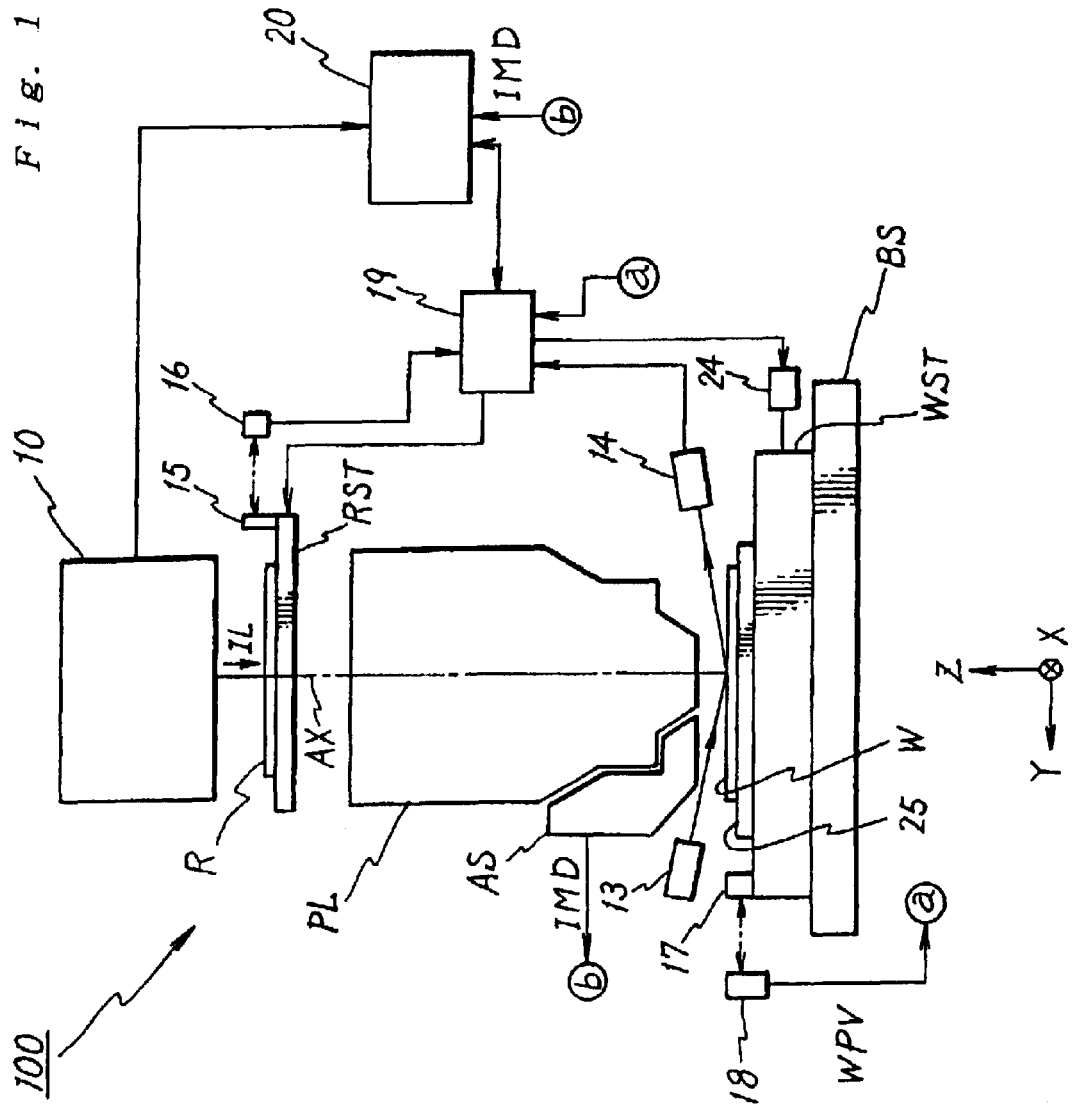
FIG. 1 is a schematic view showing the arrangement of an exposure apparatus according to an embodiment.

FIG. 1 shows a schematic arrangement of an exposure apparatus 100 according to an embodiment of the present invention. This exposure apparatus 100 is a step-and-scan projection exposure apparatus. The exposure apparatus 100 comprises an illumination system 10, a reticle stage RST for holding a reticle R as a mask, a projection optical system PL, a wafer stage WST on which a wafer W as a substrate (object) is placed, an alignment microscope AS as an image pickup unit, a main control system 20 for systematically controlling the overall apparatus, and the like.

The illumination system 10 includes a light source, an illuminance uniforming optical system comprising a fly-eye lens as an optical integrator a relay lens, a variable ND filter, a reticle blind, a dichroic mirror, and the like (none of them are shown). The arrangement of such illumination system is disclosed in, e.g., Japanese Patent Laid-Open No. 10-112433. Note that the light source unit uses a KrF excimer laser light source (oscillation wavelength=248 nm), an ArF excimer laser light source (oscillation wavelength= 193 nm), a harmonic generator such as an $F_2$ laser light source (oscillation wavelength=157 nm), $Kr_2$ (krypton dimer) laser light source (oscillation wavelength=146 nm), $Ar_2$ (argon dimer) laser light source (oscillation wavelength=16 nm ), copper vapor laser light source, or YAG laser, an ultra-high-pressure mercury lamp (g-line, i-line, or the like), or the like. Note that a charged particle beam such as X-rays, electron rays, or the like may be used in place of light sent out from the aforementioned light source unit.

The operation of the illumination system 10 with this arrangement will be briefly explained below. Illumination light emitted by the light source unit enters the illuminance uniforming optical system when the shutter is open. In this way, a large number of secondary light sources are formed at the exit end of the illuminance uniforming optical system, and illumination light components sent out from a large number of secondary light sources reach the reticle blind. Illumination light transmitted through the reticle blind is output via an imaging lens system. This illumination system 10 illuminates slit-like illumination area portions, which are defined by the reticle blind, on the reticle R having circuit patterns and the like formed thereon with illumination light IL with nearly uniform illuminance.

The reticle R is fixed on the reticle stage RST by, e.g., vacuum chucking. The reticle stage RST can be finely driven in the X-Y plane perpendicular to the optical axis (which coincides with an optical axis AX of the projection optical system PL, described later) of the illumination system and can be driven at a designated can velocity in a predetermined scan direction (Y-direction in this case) by a reticle stage driver (not shown) comprising a magnetic float type two-dimensional linear actuator so as to align the reticle R. Furthermore, in this embodiment, since the magnetic float type two-dimensional linear actuator includes a Z-drive coil in addition to an X-drive coil, Y-drive coil, and the like, the reticle stage can also be finely driven in the Z-direction.

The position of the reticle stage RST within a stage moving surface is always detected by a reticle laser interferometer (to be referred to as a "reticle interferometer" hereinafter) 16 via a movable mirror 15 at a resolution of around 0.5 to 1 nm. The position information of the reticle stage RST from the reticle interferometer 16 is sent to a stage control system 19, which drives the reticle stage RST via the reticle stage driver (not shown) on the basis of the position information of the reticle stage RST.

The projection optical system PL is disposed below the reticle stage RST in FIG. 1, and the direction of its optical axis AX is defined as the Z-axis direction. As the projection optical system PL, for example, a refraction optical system which is both-side telecentric, and has a predetermined reduction ratio (e.g., 1/5, 1/4, or 1/6) is used. For this reason, when the illumination area of the reticle R is illuminated with illumination light IL coming from the illumination optical system, a reduced-scale image (partial inverted image) of the circuit pattern on the reticle R within that illumination area is formed on the wafer W, the surface of which is applied with a resist (photosensitive agent), via the projection optical system PL.

The wafer stage WST is disposed on a base BS below the projection optical system PL in FIG. 1, and a wafer holder 25 is mounted on the wafer stage WST. The wafer W is fixed by, e.g., vacuum chucking or the like on the wafer holder 25. The wafer holder 25 can tilt in any direction with respect to a plane perpendicular to the optical axis of the projection optical system PL by a driver (not shown), and can also be finely movable in the direction of the optical axis (Z-direction) of the projection optical system PL. Also, the wafer holder 25 is finely rotatable about the optical axis AX.

The wafer stage WST is movable-not only in the scan direction (Y-direction) but also in a direction (X-direction) perpendicular to the scan direction so as to locate a plurality of shot areas on the wafer W on an exposure area conjugated with the illumination region, and performs a step-and-scan operation in which an operation of scanning and exposing each shot area on the wafer W and an operation of moving the wafer to the exposure start position of the next shot are repeated. The wafer stage WST is two-dimensionally driven by a wafer stage driver 24 including a motor and the like.

The position of the wafer stage WST in the X-Y plane is always detected by a wafer laser interferometer 18 via a movable mirror 17 at a resolution of around 0.5 to 1 nm. Position information (or velocity information) WPV of the wafer stage WST is sent to the stage control system 19, which controls the wafer stage WST on the basis of this position information (or velocity information) WPV.

Figure 2A:
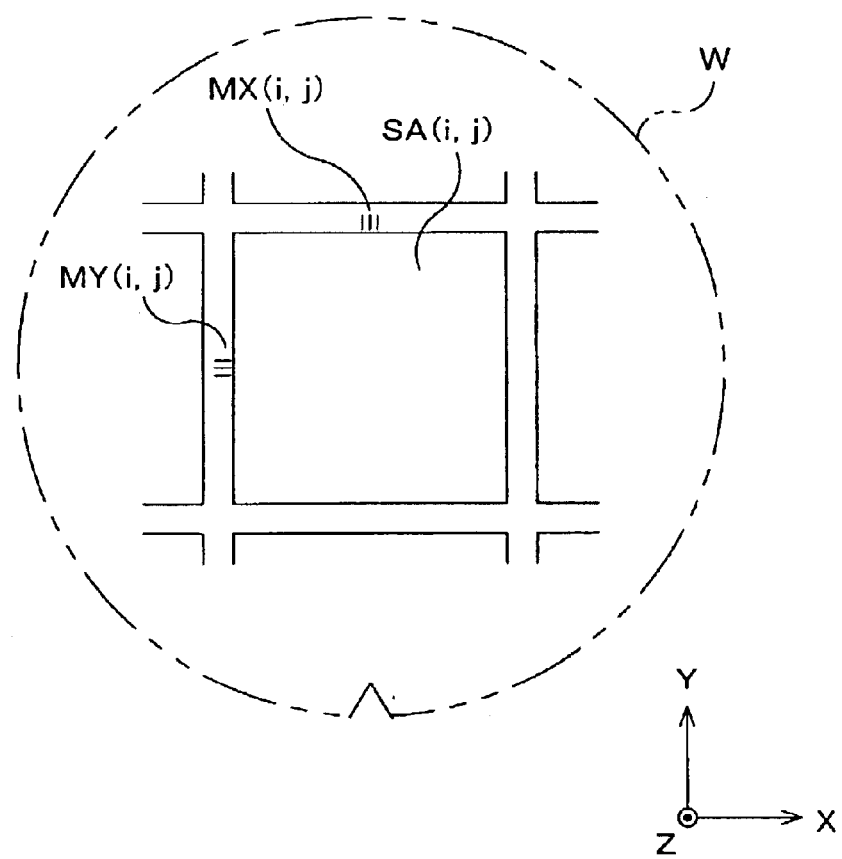
FIGS. 2A and 2B are views for explaining exemplary alignment marks.
Figure 2B:
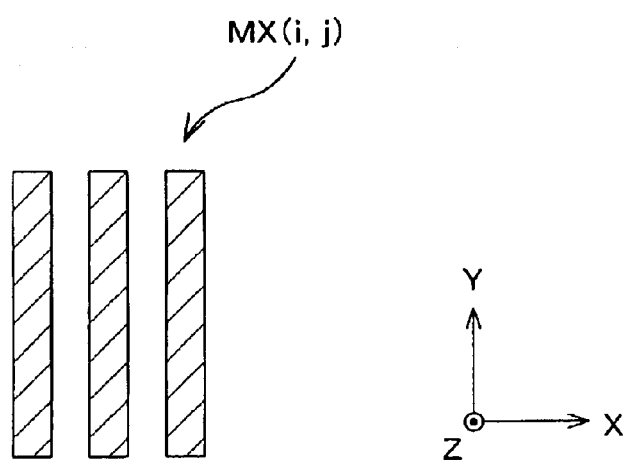

The alignment microscope AS is an offaxis alignment detector disposed on the side surface of the projection optical system PL. This alignment microscope AS outputs image pickup results of alignment marks (wafer marks) contained in each shot area on the wafer W. As the alignment marks, an X-position detection mark MX(i, j) and Y-position detection mark MY(i, j), which are formed on street lines around a shot area SA(i, j) on the wafer W, as shown in, e.g., FIG. 2A, are used. As the marks MX(i, j) and MY(i, j), a line-and-space mark having a periodic structure in the detecting direction can be used, as represented by, e.g., the mark MX(i, j) shown on a larger scale in FIG. 2B. Note that FIG. 2B illustrates a line-and-space mark having three lines. However, the number of lines in a line-and-space mark used as the mark MX(i, j) (or mark MY(i, j)) can be three or more. The alignment microscope AS outputs picked-up image data IMD as its image pickup result to the main control system 20 (see FIG. 1).

Figure 3:
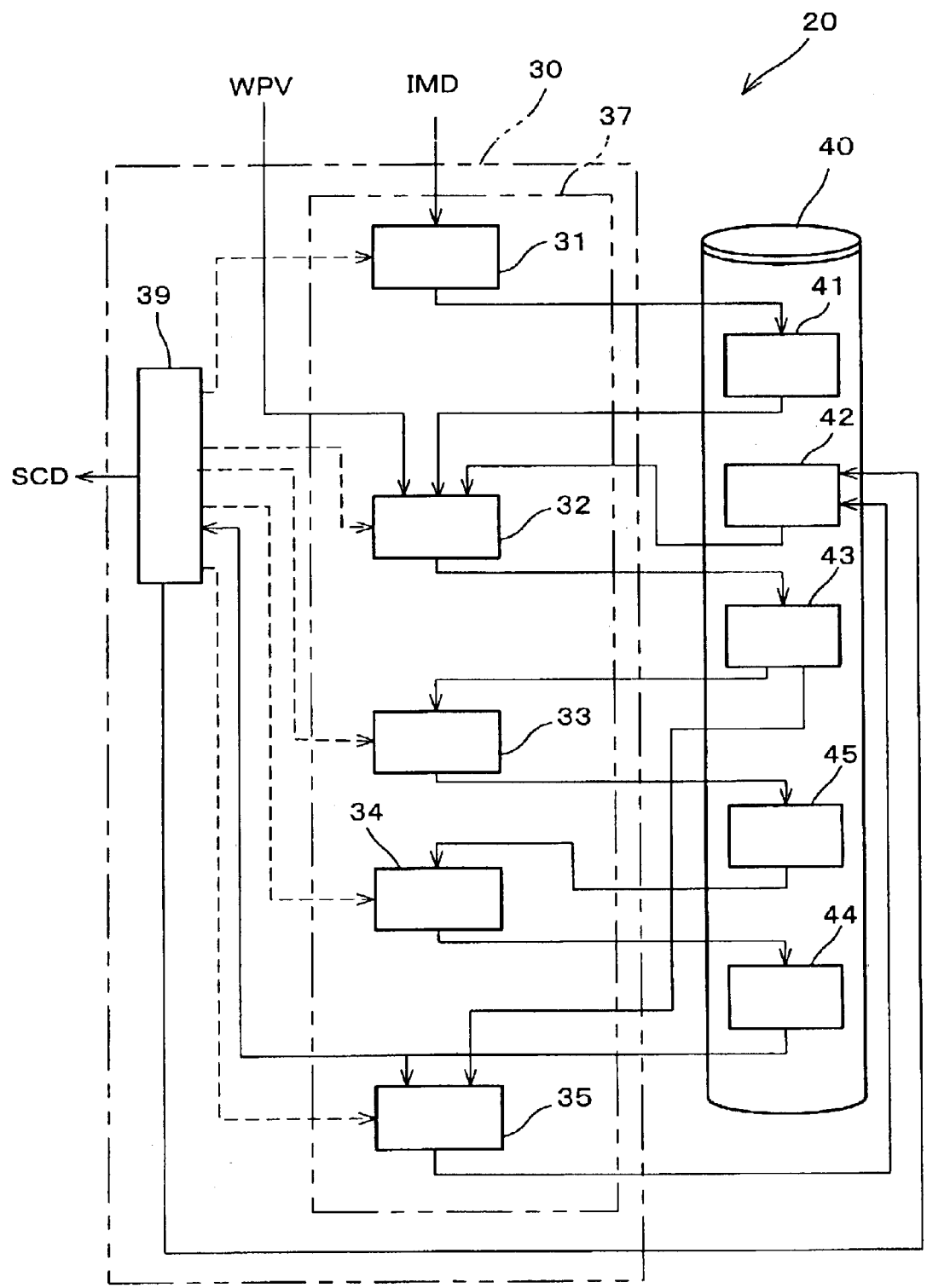
FIG. 3 is a schematic block diagram showing the arrangement of the main control system in the apparatus shown in FIG. 1.

As shown in FIG. 3, the main control system 20 comprises a main control unit 30 and storage unit 40. The main control unit 30 comprises a control unit 39 which controls the operation of the exposure apparatus 100 by, e.g., supplying stage control data SCD to the stage control system 19 and serves as a set selection unit for selecting a sample set and replacement candidate set, and a position arithmetic unit 37. The position arithmetic unit 37 comprises a picked-up image data acquisition unit 31, a mark information calculation unit 32 for calculating position information of picked-up marks MX and MY on the basis of the picked-up image data acquired by the picked-up image data acquisition unit 31, a parameter calculation unit 33 for calculating estimations of position parameters which uniquely determine the arrangement of shot areas SA, a valid value calculation unit 34 for calculating statistically valid position parameter values, and an evaluation unit 35 for evaluating possibility of replacing a sample set by another one containing a fewer number of elements. The storage unit 40 has picked-up image data stored area 41, sample set information storage area 42, mark information storage area 43, estimation storage area 45, and valid value storage area 44 therein.

Note that the aforementioned alignment microscope AS, control unit 39, and position arithmetic unit 37 constitute a position detector. Also, the mark information arithmetic unit 32, parameter calculation unit 33, and valid value calculation unit 34 constitute an estimation calculation unit, and the estimation calculation unit and evaluation unit, 35 constitute An evaluation arithmetic unit. Furthermore, the alignment microscope AS and picked-up image data acquisition unit 31 constitute a measurement unit. Moreover, the parameter calculation unit 33 and valid value calculation unit 34 constitute a parameter determination unit. In FIG. 3, the flow of data is indicated by the solid arrows, and the flow of control is indicated by the dotted arrow. The respective operations of the units in the main control system 20 will be described later.

In this embodiment, the main control system 20 is constituted by combining various units. Alternatively, the main control system 20 may be constituted as a computer system, and the respective functions of the units that constitute the main control unit 30 may be implemented by programs installed in the computer.

Referring back to FIG. 1, in the exposure apparatus 100, an oblique-incident-type multi-point focus detection system is fixed to a support portion (not shown) that supports the projection optical system PL, and comprises an illumination optical system 13 which directs imaging light beams used to form a plurality of slit images in an oblique direction with respect to the direction of the optical axis AX toward the best imaging surface of the projection optical system PL, and a light-receiving optical system 14 for receiving these imaging light beams reflected by the surface of the wafer W via slits. The stage control system 19 drives the wafer holder 25 in the Z-direction and an oblique direction on the basis of wafer position information from this multi-point focus detection system (13, 14). The detailed arrangement and the like of this multi-point focus position detection system are disclosed in, e.g., Japanese Patent Laid-Open No. 6-283403, its corresponding U.S. Pat. No. 5,448,332, and the like. The disclosures in the above Japanese Patent Laid-Open and U.S. patent are incorporated herein by reference as long as the national laws in designated states or elected states, to which this international application is applied, permit.

In the exposure apparatus 100 with the above arrangement, the arrangement coordinate position of each shot area on the wafer W is detected as follows. As a precondition for detecting the arrangement coordinate position of each shot region, assume that marks MX(i, j) and MY(i, j) are already formed on the wafer W in wafer processing up to the previous layer (e.g., in a process for the first layer).

Figure 4:
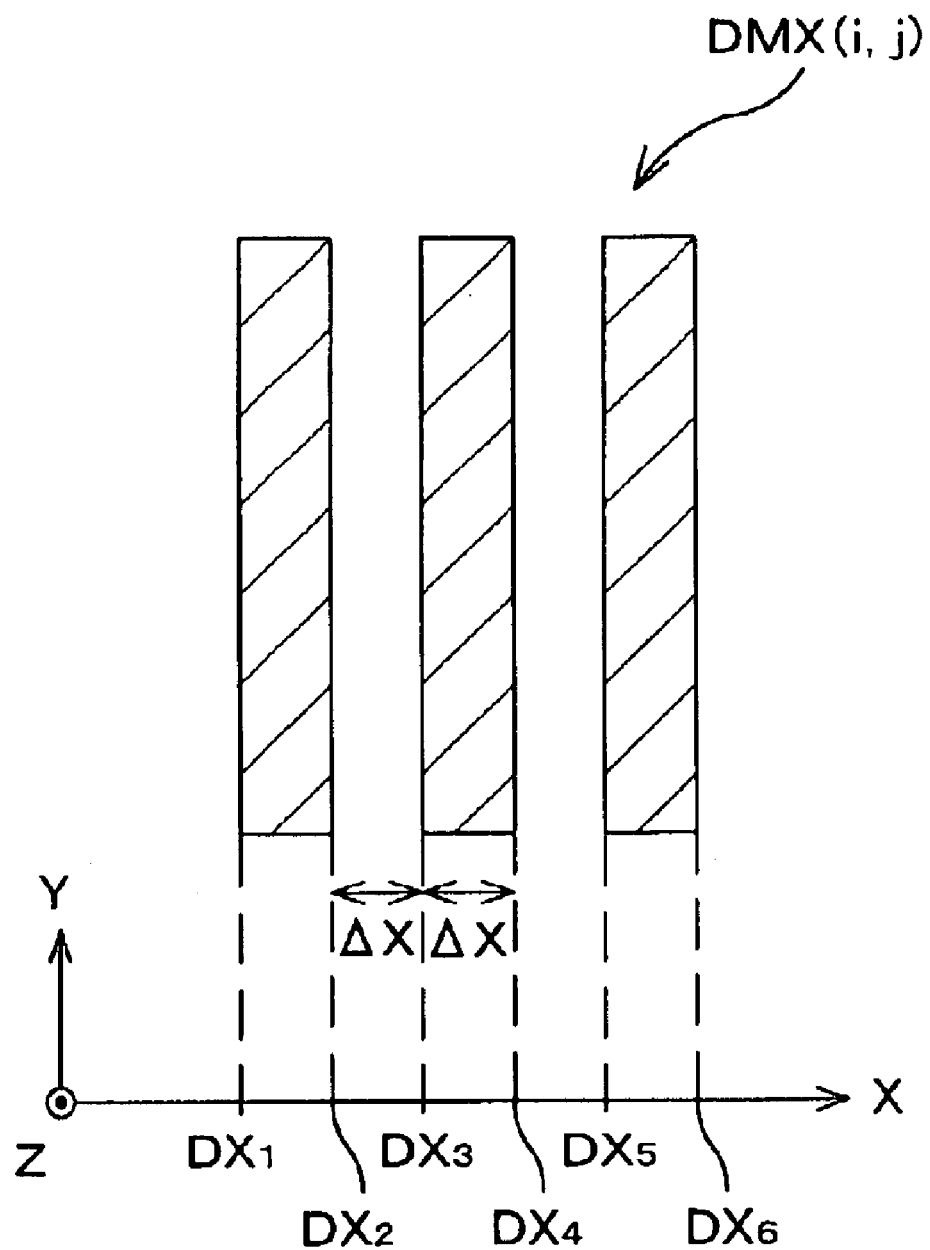
FIG. 4 is a view for explaining a design value of a transferred mark.

Also, X-positions $\{DX_1(i, j), DX_2(i, j), DX_3(i, j), DX_4(i, j), DX_5(i, j), DX_6(i, j)\}$ of boundaries (to be referred to as "edges" hereinafter) between lines and spaces in a mark DMX(i, j), ideal in terms of design, corresponding to the mark MX(i, j) are known, as shown in FIG. 4. In FIG. 4, edge positions $DX_k(i, j)$ (k=1 to 6) are expressed by $DX_k$. That is, assume $$DX_{k+1}(i, j) - DX_k(i, j) = \Delta X \tag{1}$$

for the edge positions $DX_k(i, j)$ (k=1 to 6). Also, the X-position $DX_X$ of the mark DMX(i, j) is defined by $$DX_X(i, j) = \left\{\sum_{k=1}^{6} DX_k(i, j)\right\} / 6 \tag{2}$$

and is known. Furthermore, a Y-position $DY_x(i, j)$ of the mark DMX(i, j) is determined upon design, and is known.

Likewise, Y-positions $\{DY_1(i, j), DY_2(i, j), DY_3(i, j), DY_4(i, j), DY_5(i, j), DY_6(i, j)\}$ of the edges in a mark DMY(i, j), ideal in terms of design, corresponding to the mark MY(i, j) are known as in the mark DMX(i, j). That is, assume $$DY_{k+1}(i, j) - DY_k(i, j) = \Delta Y \tag{3}$$

for edge positions $DY_k(i, j)$ (k=1 to 6). Also, the Y-position $DY_x$ of the mark DMY(i, j) is defined by $$DY_Y(i, j) = \left\{\sum_{k=1}^{6} DY_k(i, j)\right\} / 6 \tag{4}$$

and is known. Furthermore, an X-position $DX_y(i, j)$ of the mark DMY(i, j) is determined-upon design, and is known.

Detection of arrangement coordinate positions of shot areas on a plurality of wafers W (e.g., wafers for one lot) on which similar patterns (including the first number of marks) are formed by wafer processing up to the previous layer will be described below based on the flow chart shown in FIG. 5 with reference to other drawings as needed.

Figure 5:
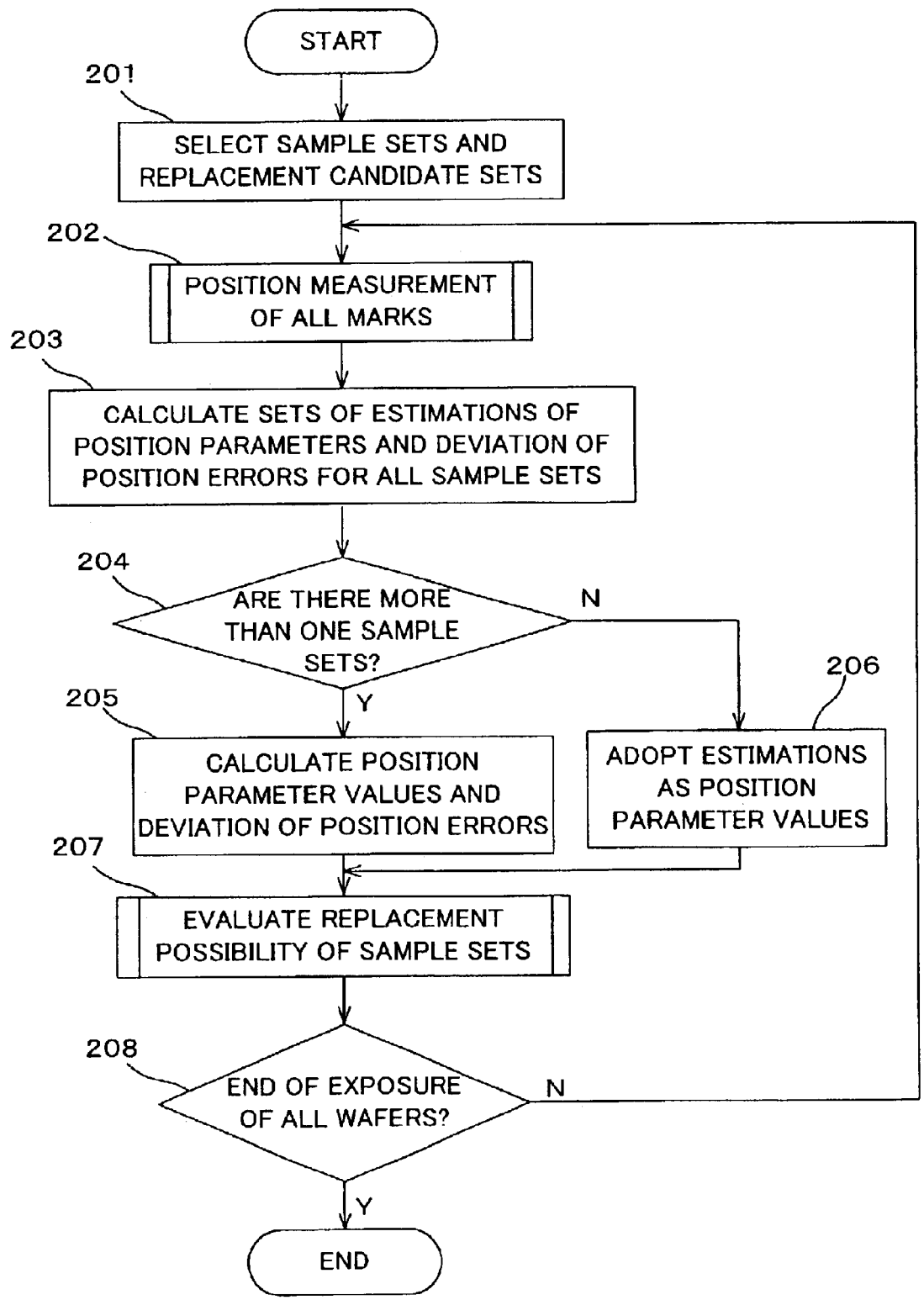
FIG. 5 is a flow chart (part 1) for explaining a position detection operation.

In step 201 in FIG. 5, the control unit 39 selects P (>1) sample sets $S_p\{MX(i_{pm}, j_{pm}), MY(i_{ps}, j_{ps})\}$ (p=1 to P, m=1 to M (third number), s=1 to M, M>4), and also Q (>1) replacement candidate sets $R_q\{MX(i_{qn}, j_{qn}), MY(i_{qt}, j_{qt})\}$ (q=1 to Q, n=1 to N (fourth number), t=1 to N, 4≦N<M), and stores element information of the sample sets $S_p$ and replacement candidate sets $R_q$ in the sample set information storage area 42 in FIG. 3.

Note that M marks $MX(i_{pm}, j_{pm})$ and M marks $MY(i_{ps}, j_{ps})$ as elements of each sample set $S_p$ are respectively selected not to line up upon design. Also, when comparing any two of the sample sets $S_p$, each set includes at least one element that the other does not include.

N marks $MX(i_{qn}, j_{qn})$ and N marks $MY(i_{qt}, j_{qt})$ as elements of each replacement candidate set $R_q$ are also respectively selected not to line up upon design. Furthermore, when comparing any two of the replacement candidate sets $R_q$, each set includes at least one element that the other does not include.

In this embodiment, the numbers of marks $MX(i_{pm}, j_{pm})$ and marks $MY(i_{ps}, j_{ps})$ as elements of the sample set $S_p$ are equal to each other (M), but may be different from each other. In such case, each of the numbers of marks $MX(i_{pm}, j_{pm})$ and marks $MY(i_{ps}, j_{ps})$ as elements of the sample set $S_p$ must be three or more, and the total of them must be larger than 6. Also, in this embodiment, the numbers of marks $MX(i_{qn}, j_{qn})$ and marks $MY(i_{qt}, j_{qt})$ as elements of the replacement candidate set $R_q$ are equal to each other (N), but may be different from each other. In such case as well, each of the numbers of marks $MX(i_{qn}, j_{qn})$ and marks $MY(i_{qt}, j_{qt})$ as elements of the replacement candidate set $R_q$ must be three or more, and the total of them must be larger than 6.

The first wafer W is loaded onto the wafer holder 25 by a wafer loader (not shown), and alignment with coarse accuracy (prealignment) is done by the main control system 20 moving the wafer via the stage control system 19 so that marks $MX(i, j)$ and $MY(i, j)$ are placed within the observation field of view of the alignment-microscope AS. Such prealignment is done by the main control system 20 (more specifically, control unit 39) via the stage control system 19 on the basis of observation of the outer shape of the wafer W, the observation result of marks $MX(i, j)$ and $MY(i, j)$ in a broader field of view, and position information (or velocity information) from the wafer interferometer 18.

Referring back to FIG. 5, the positions of the marks $MX(i_{pm}, j_{pm})$, $MY(i_{ps}, j_{ps})$, $MX(i_{qn}, j_{qn})$, and $MY(i_{qt}, j_{qt})$ as elements of the sample sets $S_p$ or replacement candidate sets $R_q$ are measured in subroutine 202.

Figure 6:
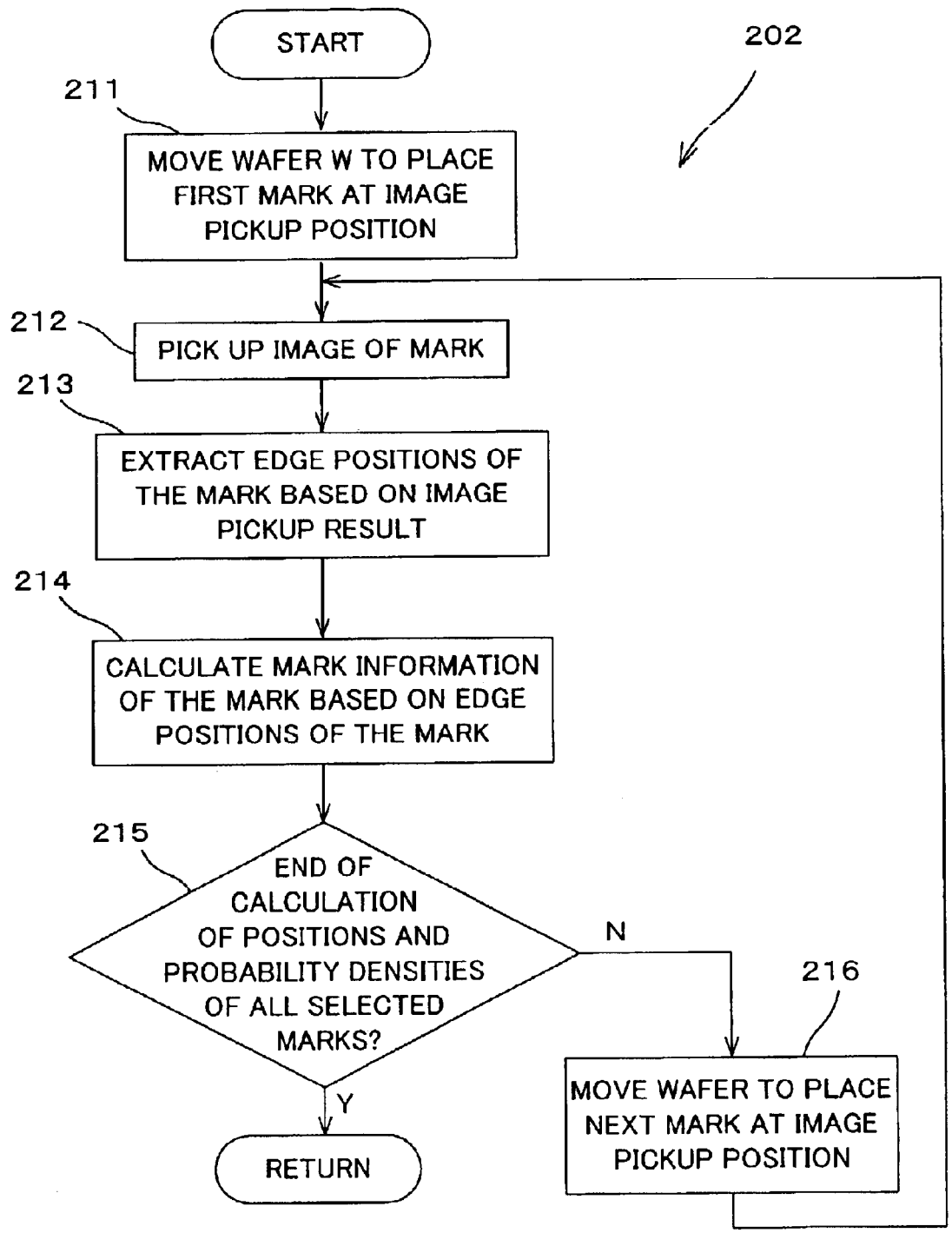
FIG. 6 is a flow chart (part 2) for explaining the position detection operation.

In subroutine 202, the wafer W is moved to locate the first mark (X-position detection mark $MX(i_{11}, j_{11})$) at the image pickup position of the alignment microscope AS in step 211 in FIG. 6. Such movement is done under the control of the main control system 20 via the stage control system 19.

Subsequently, the alignment microscope AS picks up an image of the mark $MX(i_{11}, j_{11})$ in step 212. Then, the picked-up image data acquisition unit 31 stores inputted picked-up image data IMD in the picked-up image data storage area 41 in accordance with an instruction from the control unit 39, thus acquiring picked-up image data IMD.

In step 213, the mark information calculation unit 32 reads out picked-up image data associated with the mark $MX(i_{11}, j_{11})$ from the picked-up image data storage area 41, and extracts the X-positions of six edges as position information in the mark $MX(i_{11}, j_{11})$ on the basis of the picked-up image data and position information (or velocity information) WPV from the wafer interferometer 18 in accordance with an instruction from the control unit 39. In this manner, $(FX_1(i_{11}, j_{11}), FX_2(i_{11}, j_{11}), FX_3(i_{11}, j_{11}), FX_4(i_{11}, j_{11}), FX_5(i_{11}, j_{11}), FX_6(i_{11}, j_{11}))$ shown in FIG. 7 are extracted as the X-positions of the six edges.

Figure 7:
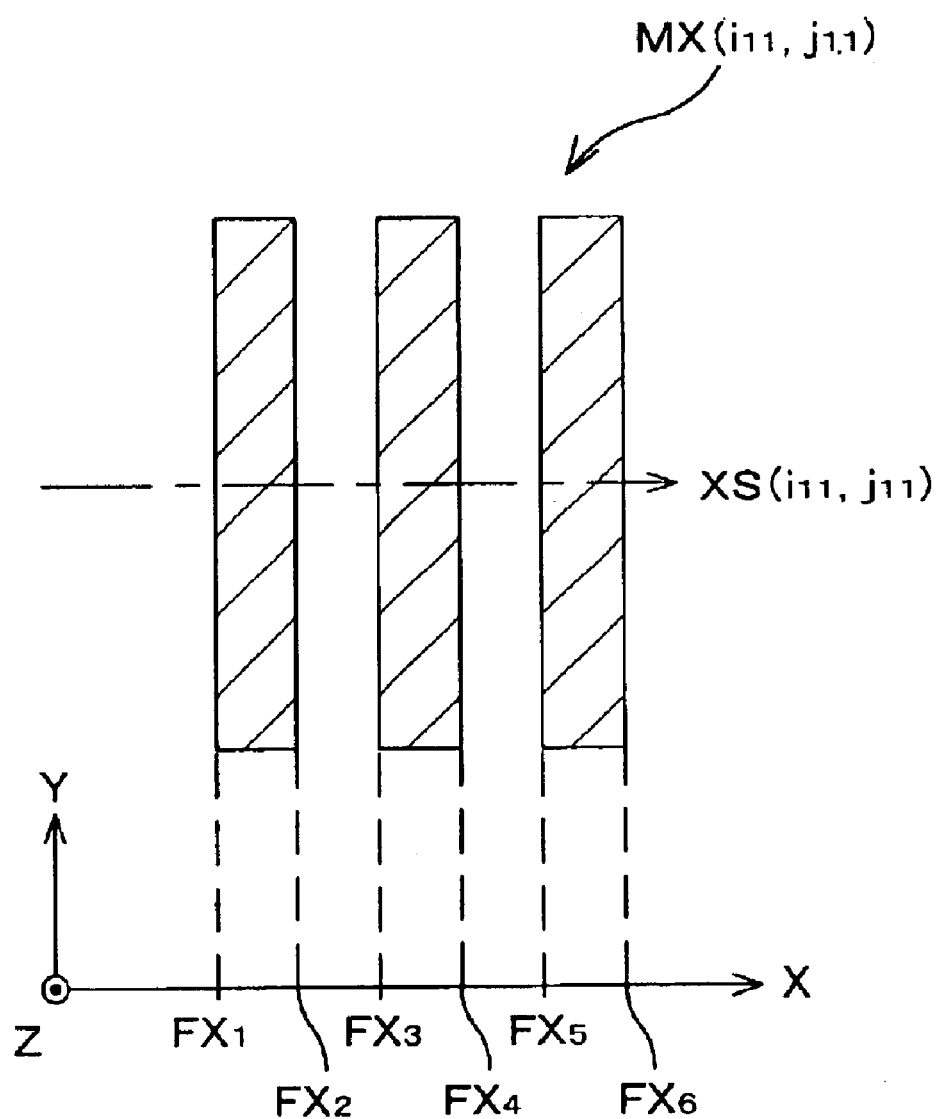
FIG. 7 is a view for explaining a measurement result of a mark.

Such extraction of the X-positions of the edge can be implemented by analyzing a waveform obtained by scanning the picked-up image data along an $XS(i_{11}, j_{11})$ axis which passes all the three line portions of the mark $MX(i_{11}, j_{11})$ and is parallel to the X-axis, as shown in FIG. 7, or by analyzing a waveform obtained by integrating the picked-up image data in the Y-direction. Note that the latter method requires a larger arithmetic volume but can accurately extract the X-positions of the edges.

Referring back to FIG. 6, in step 214 the mark information calculation unit 32 calculates a position $FX(i_{11}, j_{11})$ of the mark $MX(i_{11}, j_{11})$ and a probability density $PFX(i_{11}, j_{11})$ of that position as follows on the basis of the edge positions $FX_k(i_{11}, j_{11})$ (k=1 to 6) of the mark $MX(i_{11}, j_{11})$ extracted in step 213, and edge positions $DX_k(i_{11}, j_{11})$ of a ideal mark $DMX(i_{11}, j_{11})$ corresponding to the mark $MX(i_{11}, j_{11})$.

The mark information calculation unit 32 calculates an X-position $FX(i_{11}, j_{11})$ of the mark $MX(i_{11}, j_{11})$ by $$FX(i_{pm}, j_{pm}) = \left\{\sum_{k=1}^{6} FX_k(i_{pm}, j_{pm})\right\} / 6 \quad (5)$$

More specifically, the average value of the edge positions $FX_k(i_{11}, j_{11})$ (k=1 to 6) of the mark $MX(i_{11}, j_{11})$ is calculated as the X-position $FX(i_{11}, j_{11})$ of the mark $MX(i_{11}, j_{11})$.

The mark information calculation unit 32 then calculates errors $dFX_k(i_{11}, j_{11})$ of the measured edge positions $FX_k(i_{11}, j_{11})$ corresponding to ideal edge positions $DX_k(i_{11}, j_{11})$ by $$dFX_k(i_{11}, j_{11}) = FX_k(i_{11}, j_{11}) - DX_k(i_{11}, j_{11}) \quad (6)$$

and then calculates an average value $dFX(i_{11}, j_{11})$ and standard deviation $\sigma X(i_{11}, j_{11})$ of the errors $dFX_k(i_{11}, j_{11})$ by $$dFX(i_{pm}, j_{pm}) = \left\{\sum_{k=1}^{6} dFX_k(i_{pm}, j_{pm})\right\} / 6 \quad (7)$$

$$\sigma X(i_{pm}, j_{pm}) = \left[\left\{\sum_{k=1}^{6} (dFX_k(i_{pm}, j_{pm}) - dFX(i_{pm}, j_{pm}))^2\right\} / 5\right]^{1/2} \quad (8)$$

Note that the X-position $FX(i_{11}, j_{11})$ of the mark $MX(i_{11}, j_{11})$ given by equation (5), the X-position $DX_X(i_{11}, j_{11})$ of the aforementioned mark $DMX(i_{11}, j_{11})$, and the average value $dFX(i_{11}, j_{11})$ of the errors $dFX_k(i_{11}, j_{11})$ satisfy:

$$FX(i_{11}, j_{11}) = DX_X(i_{11}, j_{11}) + dFX(i_{11}, j_{11}) \quad (6A)$$

Hence, upon calculating the X-position $FX(i_{11}, j_{11})$ of the mark $MX(i_{11}, j_{11})$, the value $dFX(i_{11}, j_{11})$ may be calculated by equation (7), and the X-position may be calculated by equation (6A) using this value in place of a calculation given by equation (5).

Upon calculating the value $dFX(i_{11}, j_{11})$, in place of a calculation given by equation (7), after the value $FX(i_{11}, j_{11})$ has been calculated by equation (5), the value $dFX(i_{11}, j_{11})$ can be calculated by $$dFX(i_{11}, j_{11}) = FX(i_{11}, j_{11}) - DX_X(i_{11}, j_{11}) \quad (6B)$$

Since the generation factors of the errors $dFX_k(i_{11}, j_{11})$ are considered to be random, the mark information calculation device 32 assumes that their distribution is a normal distribution, and that a probability density function $f_{X11}(dx)$ of the errors $dFX_k(i_{11}, j_{11})$ is given by $$f_{X11}(dx) = \frac{1}{\sqrt{2\pi} \cdot \sigma X(i_{11}, j_{11})} \cdot \exp\left[\frac{\{dx - dFX(i_{11}, j_{11})\}^2}{2(\sigma X(i_{11}, j_{11}))^2}\right] \quad (9)$$

Based on such estimation, the mark information calculation unit 32 calculates a probability density that the value of a variable dx is $dFX(i_{11}, j_{11})$, i.e., an occurrence probability $pFX(i_{11}, j_{11})$ that the X-position of the mark $MX(i_{11}, j_{11})$ takes a value $FX(i_{11}, j_{11})$ by $$pFX(i_{11}, j_{11}) = f_{X11}(dFX(i_{11}, j_{11})) = \{(2\pi)^{1/2} \cdot \sigma X(i_{11}, j_{11})\}^{-1} \quad (10)$$

The mark information calculation unit 32 stores the position $FX(i_{11}, j_{11})$ of the mark $MX(i_{11}, j_{11})$ and its occurrence probability $pFX(i_{11}, j_{11})$ calculated in this way in the mark information storage area 43. In this manner, calculations of the mark information that pertains to the first mark $MX(i_{11}, j_{11})$ are completed.

Figure 8A:
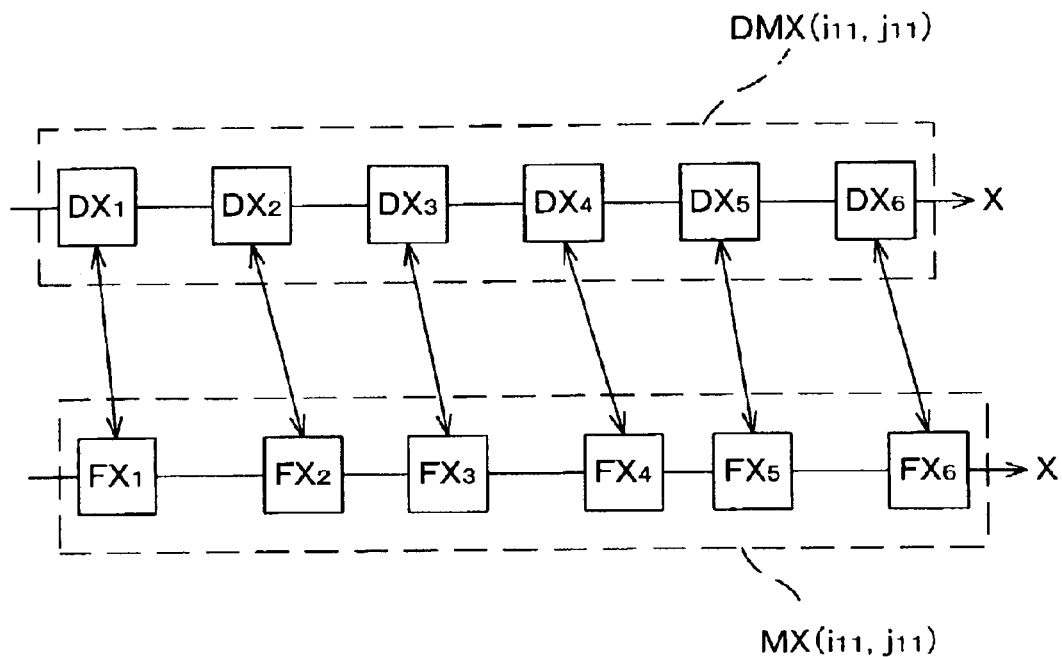
FIGS. 8A and 8B are views showing an example of a mark measurement result and probability density function.
Figure 8B:
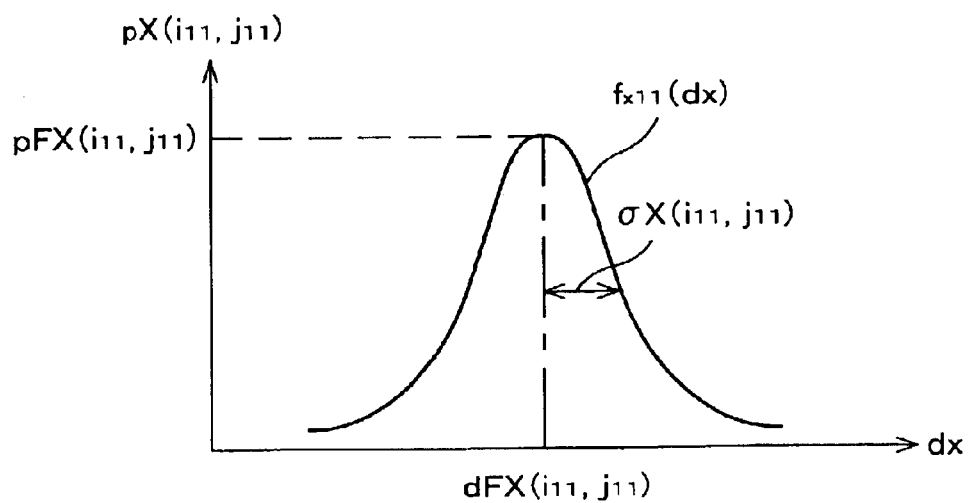
Figure 9A:
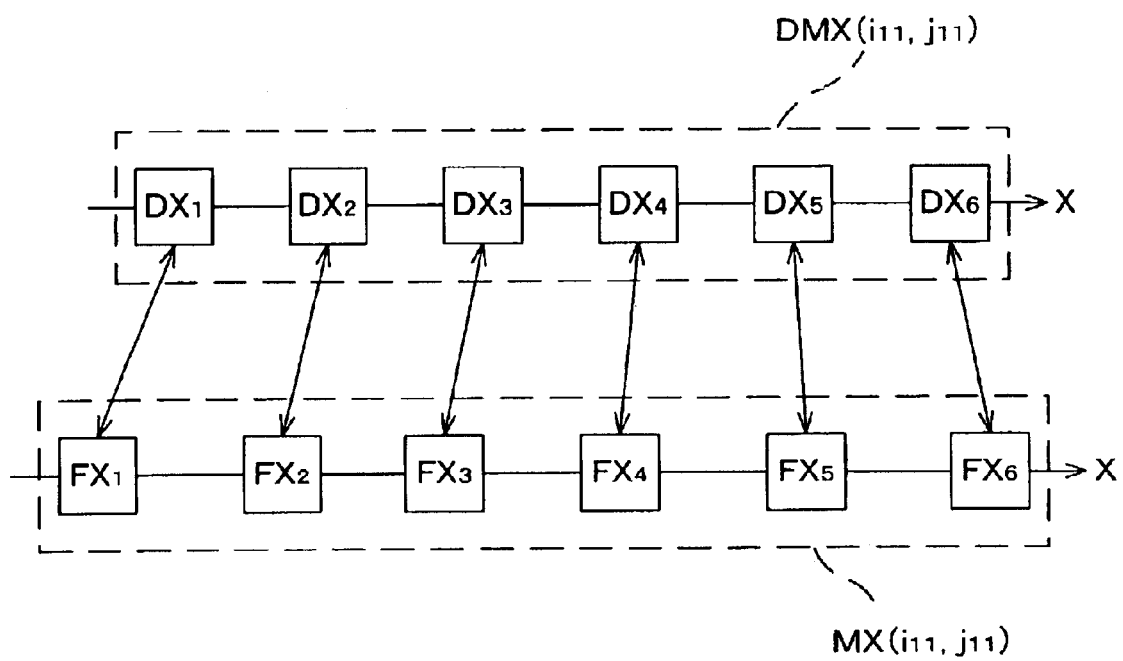
FIGS. 9A and 9B are views showing another example of a mark measurement result and probability density function.
Figure 9B:
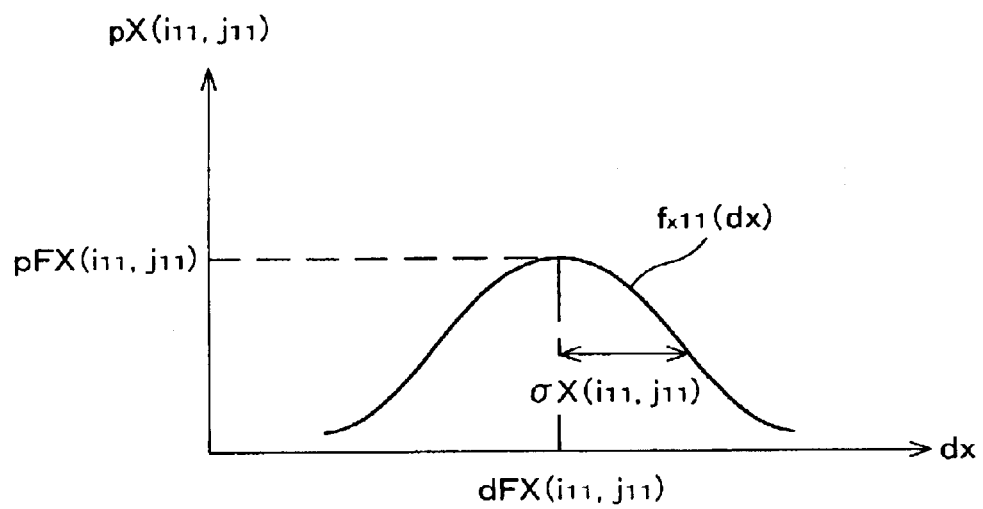

FIGS. 8A and 8B show an example wherein the X-position $FX(i_{11}, j_{11})$ of the mark $MX(i_{11}, j_{11})$ and its occurrence probability $pFX(i_{11}, j_{11})$ are calculated on the basis of the measured edge positions $FX_k(i_{11}, j_{11})$, and FIGS. 9A and 9B show another example.

In the example shown in FIGS. 8A and 8B, the errors $dFX_k(i_{11}, j_{11})$ of the measured edge positions $FX_k(i_{11}, j_{11})$ corresponding to the ideal edge positions $DX_k(i_{11}, j_{11})$ are relatively uniform, as shown in FIG. 8A. Note that FIG. 8A illustrates the edge positions $DX_k(i_{11}, j_{11})$ as elements on the X-axis in the mark $DMX(i_{11}, j_{11})$, and has symbols $DX_k$ attached onto those elements. Also, FIG. 8A illustrates the edge positions $FX_k(i_{11}, j_{11})$ as elements on the X-axis in the mark $MX(i_{11}, j_{11})$, and has symbols $FX_k$ attached onto those elements.

In the mark $MX(i_{11}, j_{11})$ for which the edge positions $FX_k(i_{11}, j_{11})$ shown in FIG. 8A are measured, the probability density function $f_{x11}(dx)$ of the error distribution is steep, as shown in FIG. 8B. That is, the standard deviation $\sigma X(i_{11}, j_{11})$ is small. As a result, a probability density $pFX(i_{11}, j_{11})$ that an error takes a value $dFX(i_{11}, j_{11})$, i.e., the X-position of the mark $MX(i_{11}, j_{11})$ takes a value $FX(i_{11}, j_{11})$ becomes larger than that in FIG. 9B to be described below.

Meanwhile, in the example shown in FIGS. 9A and 9B, the errors $dFX_k(i_{11}, j_{11})$ of the measured edge positions $FX_k(i_{11}, j_{11})$ corresponding to the ideal edge positions $DX_k(i_{11}, j_{11})$ greatly vary, as shown in FIG. 9A. Note that FIG. 9A uses the same expression method as FIG. 8A.

In the mark $MX(i_{11}, j_{11})$ for which the edge positions $FX_k(i_{11}, j_{11})$ shown in FIG. 9A are measured, the probability density function $f_{x11}(dx)$ of the error distribution is gradual, as shown in FIG. 9B. That is, the standard deviation $\sigma X(i_{11}, j_{11})$ of the error distribution takes a large value. As a result, the probability density $pFX(i_{11}, j_{11})$ that an error takes the value $dFX(i_{11}, j_{11})$, i.e., the X-position of the mark $XM(i_{11}, j_{11})$ assumes the value $FX(i_{11}, j_{11})$ becomes smaller than that in FIG. 8B mentioned above.

Referring back to FIG. 6, it is checked in step 215 if mark information calculations for all the selected marks are complete. In the aforementioned process, since the calculations of mark information of only one mark $MX(i_{11}, j_{11})$, i.e., the mark position $FX(i_{11}, j_{11})$ of the mark $MX(i_{11}, j_{11})$ and its probability density $pFX(i_{11}, j_{11})$ are complete, the answer in step 215 is NO, and the sequence advances to step 216.

In step 216, the control unit 39 moves the wafer W to a position where the next mark falls within the image pickup field of view of the alignment microscope AS. Such movement of the wafer W is done by moving the wafer stage WST when the control unit 39 controls the wafer drive unit 24 via the stage control system 19 on the basis of the prealignment result.

After that, the X-positions $FX(i_{pm}, j_{pm})$ of other marks $MX(i_{pm}, j_{pm})$ and their probability densities $pFX(i_{pm}, j_{pm})$, the Y-positions $FY(i_{ps}, j_{ps})$ of marks $MY(i_{ps}, j_{ps})$ and their probability densities $pFY(i_{ps}, j_{ps})$, the X-positions $FX(i_{qn}, j_{qn})$ of marks $MX(i_{qn}, j_{qn})$ and their probability densities $pFX(i_{qn}, j_{qn})$, and the Y-positions $FY(i_{qt}, j_{qt})$ of marks $MY(i_{qt}, j_{qt})$ and their probability densities $pFY(i_{qt}, j_{qt})$ are computed in the same manner as in the case of the aforementioned mark $MX(i_{11}, j_{11})$ until it is determined in step 215 that the mark information (mark positions and probability densities) of all the selected marks has been calculated. If the mark information of all the selected marks has been calculated, and the answer in step 215 is YES, subroutine 202 ends. And the sequence advances to step 203 in FIG. 5.

In step 203, the parameter calculation unit 33 reads out the X-positions $(i_{pm}, j_{pm})$ (m=1 to M) of the marks $MX(i_{pm}, j_{pm})$ and their probability densities $pFX(i_{pm}, j_{pm})$, and the Y-positions $FY(i_{ps}, j_{ps})$ (s=1 to M) of the marks $MY(i_{ps}, j_{ps})$ and their probability densities $pFY(i_{ps}, j_{ps})$ from the mark information storage area 43 for each sample set $S_p$ in accordance with an instruction from the control unit 39. The parameter calculation unit 33 then calculates the estimations of parameters which uniquely specify the arrangement of shot areas SA(i, j).

The marks MX(i, j) and MY(i, j) formed on the wafer W deviate from their ideal positions due to a mismatch between a stage coordinate system (X, Y) which specifies the position of the wafer stage WST, and the arrangement coordinate system of shot areas as a design coordinate system, i.e., a wafer coordinate system ($\alpha$, $\beta$), and such a mismatch occurs due to the following four main factors.

① Rotation of wafer: This is expressed by a residual rotation error $\theta$ of the wafer coordinate system ($\alpha$, $\beta$) with respect to the stage coordinate system (X, Y).

② Orthogonality of the stage coordinate system (X, Y): This occurs when the X-axis and Y-axis feed directions of the wafer stage WST are not accurately orthogonal to each other, and is expressed by an orthogonality error w.

③ Linear expansion/shrinkage (wafer scaling values) in the $\alpha$- and $\beta$-directions of the wafer coordinate system ($\alpha$, $\beta$): This occurs when the wafer W entirely expands/contracts due to wafer processing or the like. This expansion/shrinkage amount is expressed by wafer scaling values $R_X$ and $R_Y$ in the $\alpha$- and $\beta$-directions. Note that the wafer scaling value $R_X$ in the $\alpha$-direction is represented by the ratio between the actually measured value and design value of the distance between two points in the $\alpha$-direction on the wafer W, and the wafer scaling value $R_Y$ in the $\beta$-direction is represented by the ratio between the actually measured value and design value between two points in the $\beta$-direction.

④ Offset of the wafer coordinate system ($\alpha$, $\beta$) with respect to the stage coordinate system (X, Y): This occurs when the wafer W has entirely deviated by an infinitesimal amount with respect to the wafer stage WST and is expressed by offset amounts $O_X$ and $O_Y$.

When the aforementioned error factors ① to ④ are added, a pattern to be transferred to a target position (DX, DY), in terms of design, on the wafer coordinate system ($\alpha$, $\beta$) is transferred to a position (EX, EY) on the stage coordinate system (X, Y), of which the position is given by $$\begin{pmatrix} EX \\ EY \end{pmatrix} = \begin{pmatrix} R_X, 0 \\ 0, R_Y \end{pmatrix} \begin{pmatrix} \cos\theta, -\sin\theta \\ \sin\theta, \cos\theta \end{pmatrix} \begin{pmatrix} 1, -\tan w \\ 0, 1 \end{pmatrix} \begin{pmatrix} DX \\ DY \end{pmatrix} + \begin{pmatrix} O_X \\ O_Y \end{pmatrix} \quad (11)$$

Note that various other error factors are also present in addition to the aforementioned ones upon actual transfer, and the position (EX, EY) is considered as an expected transfer position.

In general, since the orthogonality error w and residual rotation error $\theta$ can be considered as infinitesimal amounts, the target transfer position (DX, DY) and expected transfer position (EX, EY) are related by $$\begin{pmatrix} EX \\ EY \end{pmatrix} = \begin{pmatrix} R_X, & -R_X(w+\theta) \\ R_Y \cdot \theta, & R_Y \end{pmatrix} \begin{pmatrix} DX \\ DY \end{pmatrix} + \begin{pmatrix} O_X \\ O_Y \end{pmatrix} \quad (12)$$

which expresses a first-order approximation of the trigonometric function in equation (11).

In the following description, equation (12) can also be expressed by $$\begin{pmatrix} EX \\ EY \end{pmatrix} = \begin{pmatrix} A_{11}, A_{12} \\ A_{21}, A_{22} \end{pmatrix} \begin{pmatrix} DX \\ DY \end{pmatrix} + \begin{pmatrix} O_X \\ O_Y \end{pmatrix} \quad (13)$$

where $$A_{11} = R_X \quad (14)$$

$$A_{12} = -R_X \cdot (w+\theta) \quad (15)$$

$$A_{21} = R_Y \cdot \theta \quad (16)$$

$$A_{22} = R_Y \quad (17)$$

That is, parameters which uniquely specify the arrangement of shot areas SA(i, j) are six parameters $A_{11}$, $A_{12}$, $A_{21}$, $A_{22}$, $O_X$, and $O_Y$. In step 203, the parameter calculation unit 33 calculates the estimations of these six parameters of each sample set $S_p$ as follows.

The parameter calculation unit 33 calculates an expected transfer X-position $EX(i_{pm}, j_{pm})$ of each mark $MX(i_{pm}, j_{pm})$ from the ideal transfer position $(DX_X(i_{pm}, j_{pm}), DY_X(i_{pm}, j_{pm}))$ of the mark $MX(i_{pm}, j_{pm})$ using equation (13), the $EX(i_{pm}, j_{pm})$ containing the parameters. Subsequently, the parameter calculation unit 33 calculates an expected transfer Y-position $EY(i_{ps}, j_{ps})$ of each mark $MY(i_{ps}, j_{ps})$ from the ideal transfer position $(DX_Y(i_{ps}, j_{ps}), DY_Y(i_{ps}, j_{ps}))$ of the mark $MY(i_{ps}, j_{ps})$ using equation (13), the $EY(i_{ps}, j_{ps})$ containing the parameters.

Then, the parameter calculation unit 33 calculates an error $\delta X_{pm}$ of the X-position $FX(i_{pm}, j_{pm})$, calculated based on the measurement result, relative to the expected transfer X-position $EX(i_{pm}, j_{pm})$ for each mark $MX(i_{pm}, j_{pm})$ by $$\delta X_{pm} = FX(i_{pm}, j_{pm}) - EX(i_{pm}, j_{pm}) \quad (18)$$

The parameter calculation unit 33 also calculates an error $\delta Y_{ps}$ of the Y-position $FY(i_{ps}, j_{ps})$, calculated based on the measurement result, relative to the expected transfer Y-position $EY(i_{ps}, j_{ps})$ for each mark $MY(i_{ps}, j_{ps})$ by $$\delta Y_{ps} = FY(i_{ps}, j_{ps}) - EY(i_{ps}, j_{ps}) \quad (19)$$

Normally, it is said that the more identical the ideal mark shape and actually transferred mark shape are, the more accurate mark transfer onto the wafer W has been done (except for transfer position accuracy). Therefore, the mark position is more reliable as it is calculated from the measurement results of the edge positions of the mark having a shape more identical to the ideal mark's shape. Also, the reliability level of the calculated mark position depends on the occurrence probability of the mark position, i.e., the probability density.

Hence, the parameter calculation unit 33 evaluates the errors $\delta X_{pm}$ and $\delta Y_{ps}$ calculated by equations (18) and (19) using the probability densities $pFX(i_{pm}, j_{pm})$ and $pFY(i_{ps}, j_{ps})$, and calculates evaluated errors $\epsilon X_{pm}$ and $\epsilon Y_{ps}$ by $$\epsilon X_{pm} = pFX(i_{pm}, j_{pm}) \cdot \delta X_{pm} \quad (20)$$

$$\epsilon Y_{ps} = pFY(i_{ps}, j_{ps}) \cdot \delta Y_{ps} \quad (21)$$

The parameter calculation unit 33 then calculates the estimations of the six parameters $A_{11}$, $A_{12}$, $A_{21}$, $A_{22}$, $O_X$, and $O_Y$ which minimize a variation $S_p$ given by $$S_p = \sum_{m=1}^{M} \epsilon X_{pm}^2 + \sum_{s=1}^{M} \epsilon Y_{ps}^2 \quad (22)$$

by applying the method of least squares on the basis of the evaluated errors $\epsilon X_{pm}$ and $\epsilon Y_{ps}$. More specifically, the parameter calculation unit 33 calculates estimations $A_{11p}$, $A_{12p}$, $A_{21p}$, $A_{22p}$, $O_{Xp}$, and $O_{Yp}$ of the six parameters $A_{11}$, $A_{12}$, $A_{21}$, $A_{22}$, $O_X$, and $O_Y$ by solving simultaneous equations made up of six equations obtained by setting partial differentials of the variation $S_p$ given by equation (22) by the six parameters $A_{11}$, $A_{12}$, $A_{21}$, $A_{22}$, $O_X$, and $O_Y$ to zero.

The parameter calculation unit 33 stores P groups of estimations $(A_{11p}, A_{12p}, A_{21p}, A_{22p}, O_{Xp}, O_{Yp})$ calculated in this way in the estimation storage area 45.

The valid value calculation unit 34 reads out the P sets of calculated estimations $(A_{11p}, A_{12p}, A_{21p}, A_{22p}, O_{Xp}, O_{Yp})$ from the estimation storage area 45, and calculates an X-position deviation $\sigma_p X$, Y-position deviation $\sigma_p Y$, and covariance $\sigma_p XY$ associated with each sample set $S_p$ upon adopting each group of estimations as follows.

The valid value calculation unit 34 calculates the expected transfer X-position $EX_p(i_{pm}, j_{pm})$ of each mark $MX(i_{pm}, j_{pm})$ from the ideal transfer position $(DX_X(i_{pm}, j_{pm}), DY_X(i_{pm}, j_{pm}))$ of the mark $MX(i_{pm}, j_{pm})$ using the estimations $(A_{11p}, A_{12p}, A_{21p}, A_{22p}, O_{Xp}, O_{Yp})$ as the values of the parameters $(A_{11}, A_{12}, A_{21}, A_{22}, O_X, O_Y)$ in equation (13). Subsequently, the valid value calculation unit 34 calculates the expected transfer Y-position $EY_p(i_{ps}, j_{ps})$ of each mark $MY(i_{ps}, j_{ps})$ from the ideal transfer position $(DX_Y(i_{ps}, j_{ps}), DY_Y(i_{ps}, j_{ps}))$ of the mark $MY(i_{ps}, j_{ps})$.

The valid value calculation unit 34 then calculates an error $\delta_p X_{pm}$ of the X-position $FX(i_{pm}, j_{pm})$, calculated based on the measurement result, relative to the expected transfer X-position $EX_p(i_{pm}, j_{pm})$ for each mark $MX(i_{pm}, j_{pm})$ by $$\delta_p X_{pm} = FX(i_{pm}, j_{pm}) - EX_p(i_{pm}, j_{pm}) \quad (23)$$

Subsequently, the valid value calculation unit 34 calculates an error $\delta_p Y_{ps}$ of the Y-position $FY(i_{ps}, j_{ps})$ calculated based on the measurement result from the expected transfer Y-position $EY_p(i_{ps}, j_{ps})$ for each mark $MY(i_{ps}, j_{ps})$ by $$\delta_p Y_{ps} = FY(i_{ps}, j_{ps}) - EY_p(i_{ps}, j_{ps}) \quad (24)$$

The valid value calculation unit 34 then evaluates the errors $\delta_p X_{pm}$ and $\delta_p Y_{ps}$ calculated by equations (23) and (24) using the probability densities $pFX(i_{pm}, j_{pm})$ and $pFY(i_{ps}, j_{ps})$, and calculates evaluated errors $\epsilon_p X_{pm}$ and $\epsilon_p Y_{ps}$ by $$\epsilon_p X_{pm} = pFX(i_{pm}, j_{pm}) \cdot \delta_p X_{pm} \quad (25)$$

$$\epsilon_p Y_{ps} = pFY(i_{ps}, j_{ps}) \cdot \delta_p Y_{ps} \quad (26)$$

The valid value calculation unit 34 calculates an X-position deviation $\sigma X$, Y-position deviation $\sigma_p Y$, and covariance $\sigma_p XY$ respectively by $$\sigma_p X = \left[ \left\{ \sum_{m=1}^{M} (\epsilon X_{pm})^2 \right\} / (M-1) \right]^{1/2} \quad (27)$$

$$\sigma_p Y = \left[ \left\{ \sum_{s=1}^{M} (\epsilon Y_{ps})^2 \right\} / (M-1) \right]^{1/2} \quad (28)$$

-continued $$\sigma_p XY = \left[\left\{\sum_{m=1}^{M}(\varepsilon X_{pm} \cdot \varepsilon Y_{pm})\right\} \Big/ (M-1)\right]^{1/2} \quad (29)$$

The valid value calculation unit 34 calculates a deviation $\sigma_p$ upon adopting the estimations ($A_{11p}$, $A_{12p}$, $A_{21p}$, $A_{22p}$, $O_{Xp}$, $O_{Yp}$) by $$\sigma_p = \{(\sigma_p X)^2 \cdot (\sigma_p Y)^2 - (\sigma_p XY)^2\}^{1/2} \quad (30)$$

The calculated deviations $\sigma_p$ indicate the certainties of the respective estimations ($A_{11p}$, $A_{12p}$, $A_{21p}$, $A_{22p}$, $O_{Xp}$, $O_{Yp}$), i.e., the degrees by which the respective sample sets $S_p$ represent the entire marks MX and MY.

The parameter calculation unit 33 checks in step 204 if there are a plurality of sample sets $S_p$. In the above, since the number of sample sets $S_p$ is P (>1), the answer in step 204 is YES, and the sequence advances to step 205.

In step 205, on the basis of the P groups of estimations ($A_{11p}$, $A_{12p}$, $A_{21p}$, $A_{22p}$, $O_{Xp}$, $O_{Yp}$) and deviations $\sigma_p$ that reflect the certainty, the valid value calculation unit 34 calculates weighted mean of each parameter of the estimations ($A_{11p}$, $A_{12p}$, $A_{21p}$, $A_{22p}$, $O_{Xp}$, $O_{Yp}$) using the values ($1/\sigma_p$) as respective weight coefficients of the estimations, and obtains a set of statistically valid parameter values ($A_{11O}$, $A_{12O}$, $A_{21O}$, $A_{22O}$, $O_{XO}$, $O_{YO}$). That is, the valid value calculation unit 34 computes $$A_{11O} = \left\{\sum_{p=1}^{P}(A_{11p}/\sigma_p)\right\} \Big/ \left\{\sum_{p=1}^{P}(1-\sigma_p)\right\} \quad (31)$$

$$A_{12O} = \left\{\sum_{p=1}^{P}(A_{12p}/\sigma_p)\right\} \Big/ \left\{\sum_{p=1}^{P}(1-\sigma_p)\right\} \quad (32)$$

$$A_{21O} = \left\{\sum_{p=1}^{P}(A_{21p}/\sigma_p)\right\} \Big/ \left\{\sum_{p=1}^{P}(1-\sigma_p)\right\} \quad (33)$$

$$A_{22O} = \left\{\sum_{p=1}^{P}(A_{22p}/\sigma_p)\right\} \Big/ \left\{\sum_{p=1}^{P}(1-\sigma_p)\right\} \quad (34)$$

$$O_{XO} = \left\{\sum_{p=1}^{P}(O_{Xp}/\sigma_p)\right\} \Big/ \left\{\sum_{p=1}^{P}(1-\sigma_p)\right\} \quad (35)$$

$$O_{YO} = \left\{\sum_{p=1}^{P}(O_{Yp}/\sigma_p)\right\} \Big/ \left\{\sum_{p=1}^{P}(1-\sigma_p)\right\} \quad (36)$$

Also, the valid value calculation unit 34 calculates deviation $\sigma_O$ upon adopting the statistically valid parameter values ($A_{11O}$, $A_{12O}$, $A_{21O}$, $A_{22O}$, $O_{XO}$, $O_{YO}$) by $$\sigma_O = P \Big/ \sum_{p=1}^{P}(1-\sigma_p) \quad (37)$$

The valid value calculation unit 34 stores the statistically valid parameter values ($A_{11O}$, $A_{12O}$, $A_{21O}$, $A_{22O}$, $O_{XO}$, $O_{YO}$) and deviation $\sigma_O$ calculated in this way in the valid value storage area 44 as parameter values ($AU_{11}$, $AU_{12}$, $AU_{21}$, $AU_{22}$, $OU_X$, $OU_Y$) and deviation $\sigma U$ used upon exposure of the wafer W.

In subroutine 207, the evaluation unit 35 evaluates in accordance with an instruction from the control unit 39 possibility of replacing the sample set $S_p$ by any of replacement candidate sets $R_q$.

Figure 10:
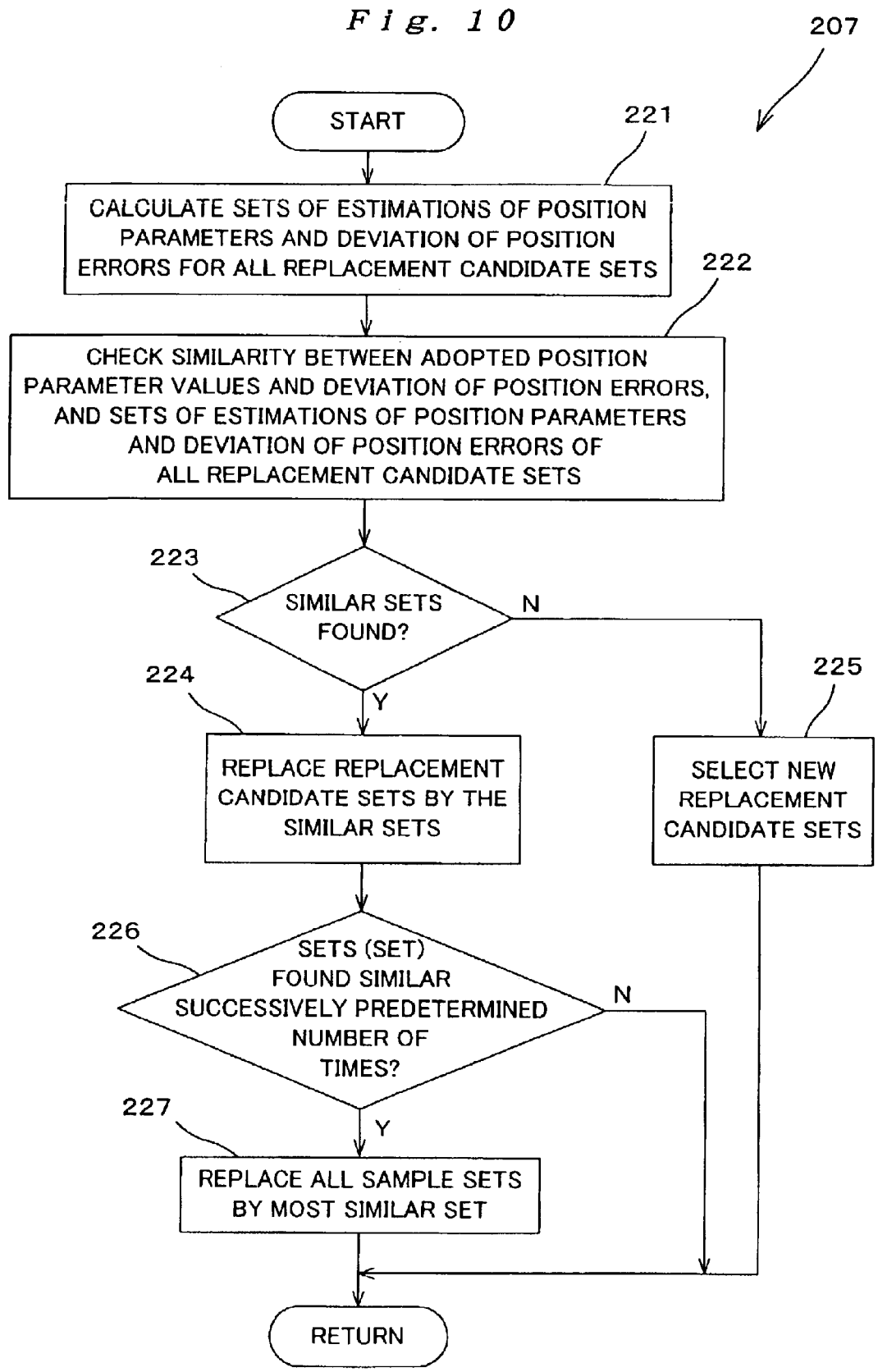
FIG. 10 is a flow chart (part 3) for explaining the position detection operation.

In subroutine 207, the evaluation unit 35 reads out X-positions $FX(i_{pn}, j_{qn})$ (n=1 to N) of marks $MX(i_{qn}, j_{qn})$ and their probability densities $pFX(i_{qn}, j_{qn})$, and Y-positions $FY(i_{qt}, j_{qt})$ (t=1 to N) of marks $MY(i_{qt}, j_{qt})$ and their probability densities $pFY(i_{qt}, j_{qt})$ from the mark information storage area 43 in step 221 of FIG. 10 in the same manner as in the aforementioned case of the sample sets $S_p$. The evaluation unit 35 calculates a estimation ($A_{11q}$, $A_{12q}$, $A_{21q}$, $A_{22q}$, $O_{Xq}$, and $O_{Yq}$) for parameters $A_{11}$, $A_{12}$, $A_{21}$, $A_{22}$, $O_X$, and $O_Y$ which uniquely specify the arrangement of shot areas SA(i, j) in the same manner as in the case of the sample sets $S_p$.

The evaluation device 35 then calculates X-position deviations $\sigma_q X$, Y-position deviations $\sigma_q Y$, and covariances $\sigma_q XY$ of respective replacement candidate sets $R_q$ upon adopting the Q sets of calculated estimations ($A_{11q}$, $A_{12q}$, $A_{21q}$, $A_{22q}$, $O_{Xq}$, $O_{Yq}$), and also deviations $\sigma_q$ upon adopting the Q sets of calculated estimations ($A_{11q}$, $A_{12q}$, $A_{21q}$, $A_{22q}$, $O_{Xq}$, $O_{Yq}$) in the same manner as in the case of the sample sets $S_p$. The calculated deviations $\sigma_q$ indicate the certainties of the respective estimations ($A_{11q}$, $A_{12q}$, $A_{21q}$, $A_{22q}$, $O_{Xq}$, $O_{Yq}$), i.e., the degrees by which the respective replacement candidate sets $R_q$ represent the entire marks MX and MY.

In step 222, the evaluation unit 35 reads out the statistically valid parameter values ($AU_{11}$, $AU_{12}$, $AU_{21}$, $AU_{22}$, $OU_x$, $OU_y$) and deviation $\sigma U$ from the valid value storage area 44, and evaluates similarities with the estimations ($A_{11q}$, $A_{12q}$, $A_{21q}$, $A_{22q}$, $O_{Xq}$, $O_{Yq}$) and deviations $\sigma_q$ associated with the replacement candidate sets $R_q$. Such evaluation is done by comprehensively considering a similarity F of parameter values given by $$F_q = |A_{11q} - AU_{11}| + |A_{12q} - AU_{12}| + \quad (38)$$
$$|A_{21q} - AU_{21}| + |A_{22q} - AU_{22}| +$$
$$|O_{Xq} - OU_X| + |O_{Yq} - OU_Y|$$

and a similarity G of deviation values given by $$G_q = |\sigma_q - \sigma U| \quad (39)$$

For example, if $$C1 < F_q \times G_q \quad (40)$$

for a predetermined value C1, it may be determined that the two sets are similar. In such a case, the similarity F of the parameter values and the similarity G of deviation values are equally handled.

On the other hand, if $$C2 < F_q + G_q \quad (41)$$

for a predetermined value C2, it may be determined that the two sets are similar. In such a case as well, the similarity F of the parameter values and the similarity G of deviation values are equally handled.

Also, if $$C3 < F_q + 3G_q \quad (42)$$

for a predetermined value C3, it is evaluated that the two sets are similar. In such case, the similarity F of the parameter values and the triple of the similarity G of deviation values are equally handled.

The evaluation unit 35 checks in step 223 if there is a replacement candidate set $R_q$ that has been found to be similar as a result of evaluation in step 222. If NO in step 223, the evaluation unit 35 sends a report indicating this to the control unit 39. The control unit 39 receives the report and selects new Q replacement candidate sets, and stores them in the sample set information storage area 42 in step 225. In this fashion, the process of subroutine 207 executed if NO in step 223 ends.

On the other hand, if YES in step 223, the evaluation unit 35 replaces the replacement candidate set information in the sample set information storage area 42 by information that pertains to only the replacement candidate set or sets found to be similar.

The evaluation unit 35 checks in step 226 if there is a replacement candidate set that is successively found to be similar a predetermined number of times. For example, when the predetermined number of times is three, since similarity evaluation has been done only once for only one wafer, the answer in step 226 is NO, and then the process of subroutine 207 ends.

If the predetermined number of times is one, the answer in step 226 is YES, and the evaluation unit 35 selects a replacement candidate set having the highest similarity from those found to be similar as a new sample set, and replaces the sample set information in the sample set information storage area 42 by information that pertains to the new sample set in step S227, thus ending the process of subroutine 207. In such a case, the number of sample sets is one from here on.

Parallel to the aforementioned process of subroutine 207, the control unit 39 calculates the arrangement coordinate positions of shot areas SA(i, j) using the parameter values ($AU_{11}$, $AU_{12}$, $AU_{21}$, $AU_{22}$, $OU_X$, $OU_Y$) calculated in step 205 in FIG. 5. Then, the reticle R and wafer W are aligned on the basis of the calculated shot area arrangement under the control of the control unit 39, and the wafer W and reticle R are synchronously moved at a velocity ratio corresponding to the projection magnification in opposite directions along the scan direction (Y-direction) while a slit-like illumination area (the center of which nearly coincides with the optical axis AX) is illuminated with illumination light IL, thus transferring a pattern on a pattern area of the reticle R onto each shot area SA(i, j) in the reduced scale. Upon completion of pattern transfer onto all the shot areas SA(i, j), the wafer is unloaded under the control of the control unit 39.

If exposure of the first wafer W is complete, and the process of the subroutine has ended in this way, the control unit 39 checks in step 208 in FIG. 5 if exposure of all wafers (e.g., wafers for one lot) is complete. In the above process, since exposure of only the first wafer is complete, the answer in step 208 is NO. The next wafer is loaded onto the wafer holder 25 by the wafer loader (not shown) in the same manner as the first wafer, and alignment with coarse accuracy (prealignment) is done by the main control system 20 moving the wafer W via the stage control system 19 so that marks MX(i, j) and MY(i, j) can be placed within the observation field of view of the alignment microscope AS. After that, steps 202 to 207 in FIG. 5 are repeated for each wafer W in the same manner as the first wafer until YES is determined n step 208.

If it is determined in step 208 in FIG. 5 that exposure of all wafers is complete, the exposure process ends.

If replacement candidate sets which are successively determined first to be similar to the sample set a predetermined number of times are found in step 226 in FIG. 10, since the most similar one of those sets is used as the subsequent sample set, the number of sample sets becomes one. As a result, NO is determined in step 204 in FIG. 5 executed thereafter, and step 206 is executed in place of step 205 mentioned above. That is, the estimations of position parameters calculated based on the position measurement results of marks MX and MY contained in the single sample set are directly adopted as parameter values ($AU_{11}$, $AU_{12}$, $AU_{21}$, $AU_{22}$, $OU_X$, $OU_Y$) used upon exposure of the wafer W.

According to the exposure apparatus of this embodiment with the aforementioned arrangement and operations, a plurality of sample sets are selected initially, and position parameters are calculated based on the result of estimating the position distribution of the entire marks MX and MY according to respective groups of the estimations and their certainties of position parameters calculated for the sample sets. Accordingly, statistically valid position parameter values can be obtained. Therefore, the wafer W can be aligned very accurately, and the pattern transfer accuracy can be improved.

Furthermore, if a set appropriate to replace the sample sets is found when searching for a replacement candidate set that reflects the position distribution of the entire marks MX and MY as much as the sample sets used to calculate the statistically valid position parameter values and contains fewer elements than any sample set, the appropriate set is used as a new sample set. Therefore, since the time required for aligning a wafer W can be shortened while maintaining statistical validity of the obtained position parameters, the throughput can be improved.

In addition, a mark position is calculated on the basis of the position information of each position measurement mark (alignment mark) obtained through measuring the alignment marks associated with each sample set, i.e., the measurement results of a plurality of edge positions of each alignment mark; the certainty of that mark position is calculated from the design values of the edge positions and errors, and parameter values (estimations) that uniquely specify the arrangement of shot areas (i, j) on the wafer W are calculated for each sample set using the certainty as the weight. Therefore, because the arrangement of the shot areas (i, j) on the wafer W is calculated using the finally obtained accurate parameter values to align the wafer W, accurate alignment can be performed, and pattern transfer with high overlap accuracy can be achieved.

The manufacture of a device using the exposure apparatus and method of this embodiment will be described below.

Figure 11:
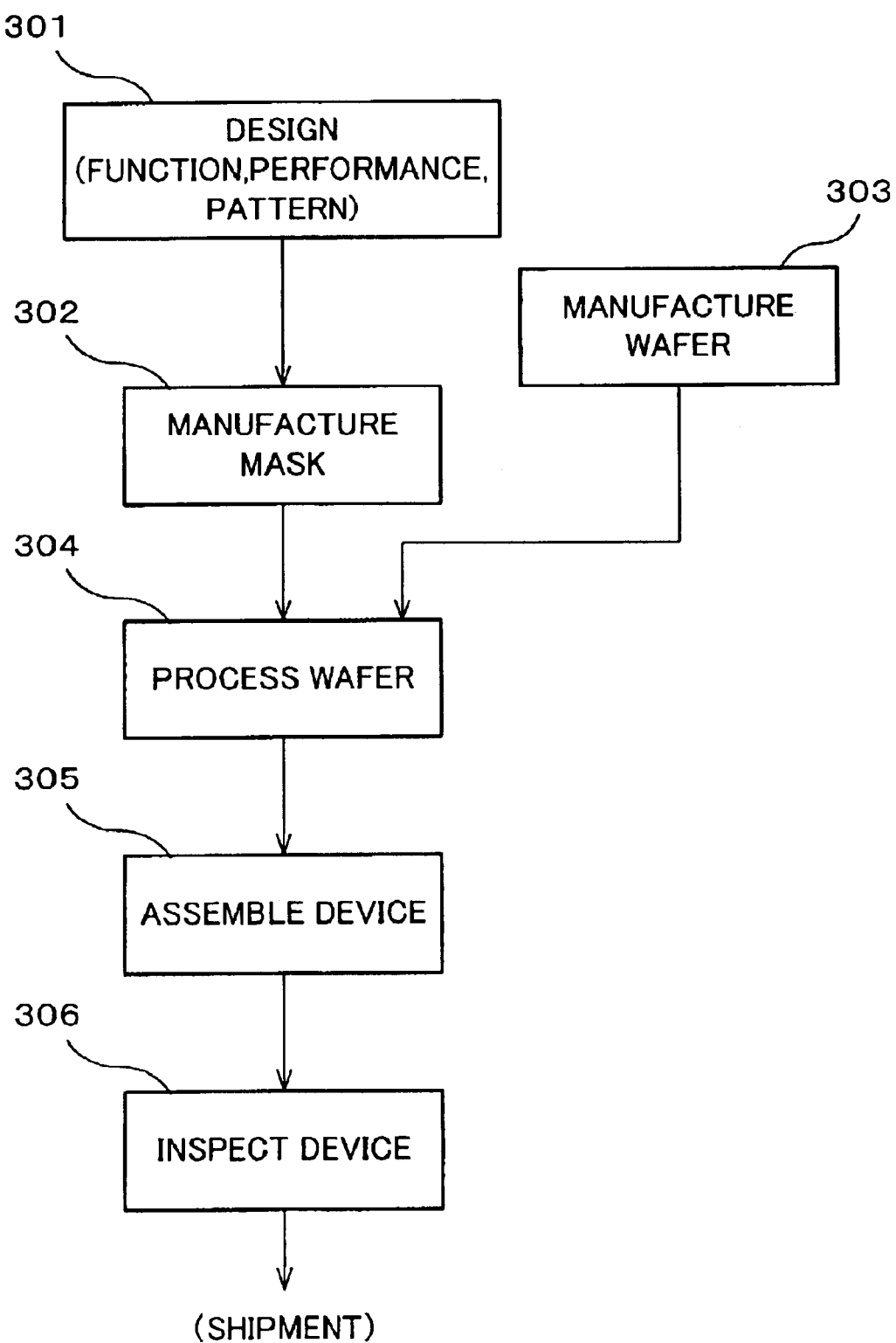
FIG. 11 is a flow chart for explaining a method of manufacturing devices using the exposure apparatus shown in FIG. 1.

FIG. 11 is a flow chart of production of devices (semiconductor chips such as IC or LSI, liquid crystal panels, CCD's, thin-film magnetic heads, micro machines, or the like) in this embodiment. As shown in FIG. 11, in step 301 (design step) function/performance design for the devices (e.g., circuit design for semiconductor devices) is performed, and also pattern design is performed. In step 302 (mask fabrication step), a mask formed with the designed circuit pattern is fabricated. On the other hand, in step 303 (wafer preparation step) a wafer is prepared using material such as silicon and the like.

In step 304 (wafer process step), an actual circuit and the like are formed on the wafer by lithography, as will be described later, using the mask and wafer prepared in steps 301 to 303. In step 305 (device assembly step), devices are assembled using the wafer processed in step 304. This step 305 includes processes such as an assembly process (dicing, bonding), packaging step (chip encapsulation), and the like.

Finally, in step 306 (inspection step) inspections such as an operation confirmation test, durability test, and the like of the devices manufactured in step 305 are performed. After these steps, the process is complete, and the devices are shipped out.

Figure 12:
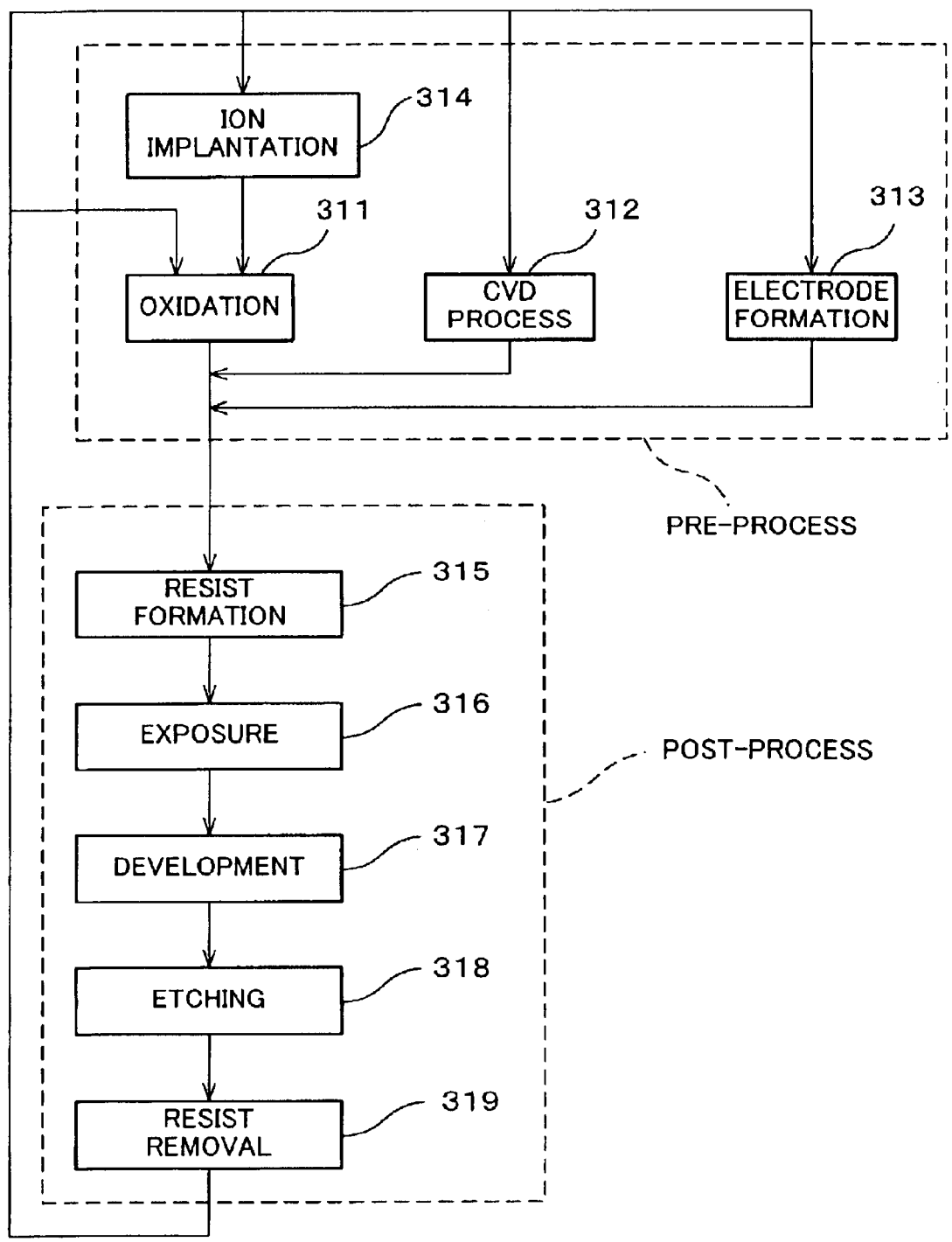
FIG. 12 is a flow chart showing a process of the wafer process step of FIG. 11.

FIG. 12 shows a detailed, exemplary flow of step 304 for manufacturing semiconductor devices. As shown in FIG. 12, the wafer surface is oxidized in step 311 (oxidation step). In step 312 (CVD step), an insulation film is formed on the wafer surface. In step 313 (electrode formation step), electrodes are formed on the wafer by deposition. In step 314 (ion implantation step), ions are implanted into the wafer. Steps 311 to 314 mentioned above constitute a pre-process of each step in the wafer process, and is selectively executed in accordance with the process required in each step.

Upon completion of the pre-process in each step of the wafer process, a post-process steps is performed as follows. In this post-process, the wafer is coated with a photosensitive agent in step 315 (resist formation step), and the above exposure apparatus transfers the circuit pattern on the mask onto the wafer aligned using the aforementioned scheme, in step 316 (exposure step). The exposed wafer is developed in step 317 (development step), and an exposing member of portions other than portions where the resist remains is removed by etching in step 318 (etching step). Then, the resist that has become unnecessary after etching is removed in step 319 (resist removal step).

By repeating the pre- and post-process steps, multi-layer circuit patterns are formed on the wafer.

In this way, devices having a micro-pattern accurately formed thereon are manufactured with high mass-productivity.

Figure 13:
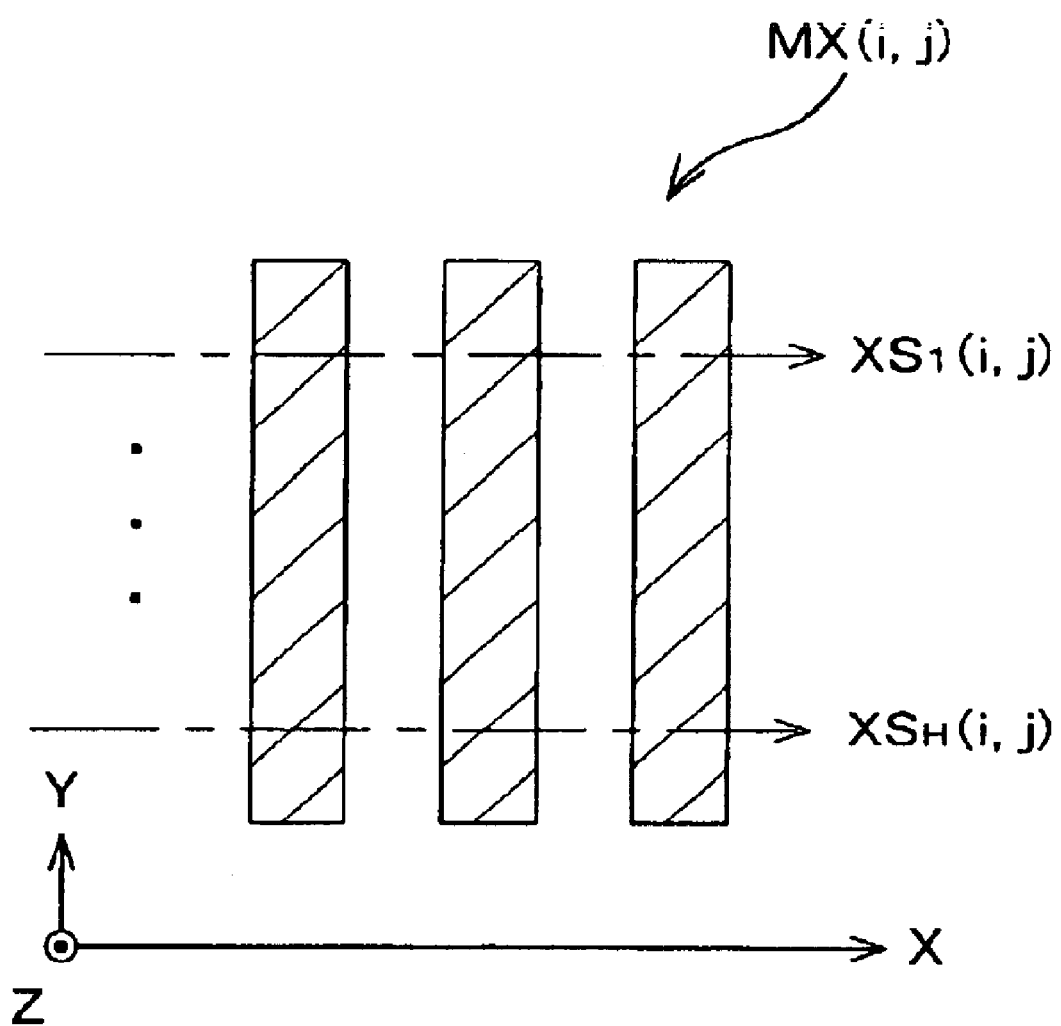
FIG. 13 is a view for explaining a modification (No. 1)

In the above embodiment, upon detecting the edge positions of the marks $MX(i_{pm}, j_{pm})$ and $MY(i_{ps}, j_{ps})$, one edge position is extracted for each edge using the picked-up image data on a single axis parallel to the direction of the mark pattern change or the integrated data in the direction perpendicular to the direction of the mark pattern change, as described above. Alternatively, as shown in FIG. 13 that representatively shows a mark MX $(i_{pm}, j_{pm})$, edge positions can be extracted along each of a plurality of (=H) axes $XS_h(i_{pm}, j_{pm})$ (h=1 to H) parallel to the direction in which the pattern of the mark $MX(i_{pm}, j_{pm})$ changes. In such a case, edge positions $FX_{kh}(i_{pm}, j_{pm})$ (k=1 to 6, h=1 to H) are extracted.

Then, an X-position $FX(i_{pm}, j_{pm})$ of the mask $MX(i_{pm}, j_{pm})$ is calculated by $$FX(i_{pm}, j_{pm}) = \left\{ \sum_{k=1}^{6} \sum_{h=1}^{H} FX_{kh}(i_{pm}, j_{pm}) \right\} / (6H) \quad (43)$$

Also, an error $dFX_{kh}(i_{pm}, j_{pm})$ of each edge position $FX_{kh}(i_{pm}, j_{pm})$ from the ideal edge position $DX_k(i_{pm}, j_{pm})$ is calculated by $$dFX_{kh}(i_{pm}, j_{pm}) = FX_{kh}(i_{pm}, j_{pm}) - DX_k(i_{pm}, j_{pm}) \quad (44)$$

After that, an average value $dFX(i_{pm}, j_{pm})$ and standard deviation $\sigma X(i_{pm}, j_{pm})$ of the errors $dFX_{kh}(i_{pm}, j_{pm})$ are respectively calculated by $$dFX(i_{pm}, j_{pm}) = \left\{ \sum_{k=1}^{6} \sum_{h=1}^{H} dFX_{kh}(i_{pm}, j_{pm}) \right\} / (6H) \quad (45)$$

$$\sigma X(i_{pm}, j_{pm}) = \left[ \left\{ \sum_{k=1}^{6} \sum_{h=1}^{H} (dFX_{kh}(i_{pm}, j_{pm}) - dFX(i_{pm}, j_{pm}))^2 \right\} / (6H - 1) \right]^{1/2} \quad (46)$$

The X-position FX $(i_{pm}, j_{pm})$ and standard deviation $\sigma X(i_{pm}, j_{pm})$ of the mark $MX(i_{pm}, j_{pm})$ calculated in this way are statistically more valid than those in the aforementioned embodiment, since the number of extracted edge positions is larger than that in the above embodiment.

Note that the Y-position $FY(i_{ps}, j_{ps})$ of each mark $MY(i_{ps}, j_{ps})$ can be calculated in the same manner as the mark $MX(i_{pm}, j_{pm})$. In such case as well, the calculated Y position $FY(i_{ps}, j_{ps})$ and standard deviation $\sigma Y(i_{ps}, j_{ps})$ of the mark $MY(i_{ps}, j_{ps})$ are statistically more valid than those in the above embodiment, since the number of extracted edge positions is larger than that in the above embodiment.

After that, optimal values of six parameters that uniquely specify the arrangement of shot areas SA(i, j) on the wafer W are calculated in the same manner as in the above embodiment. Since the optimal values of the six parameters are calculated based on statistically more valid mark positions and their certainties than the above case, higher accuracy than in the above embodiment can be assured.

In the above embodiment, the aforementioned six parameters are used as those for uniquely specifying the arrangement of shot areas SA(i, j) on the wafer W. Alternatively, even when the arrangement of shot areas SA(i, j) are uniquely specified by more parameters than the above embodiment, their optimal values can be accurately calculated as in the above embodiment.

More specifically, in the above embodiment, upon aligning shot areas SA(i, j) on the wafer, even when appropriate values of parameters that specify the arrangement of representative points, e.g. central points of the shot areas SA(i, j), are calculated, and the central point of a given shot area SA(i, j) is aligned using those parameters, sufficiently high accuracy of superposition cannot always be obtained. Such problem is caused by the following three major factors, as disclosed in, e.g., Japanese Patent Laid-Open Nos. 6-275496 and 6-349705.

⑤ Rotation of shot region: This is caused when a reticle R has rotated with respect to the stage coordinate system (X, Y) upon transferring a pattern formed on the reticle R onto a wafer W or when yawing is accidentally mixed in the movement of a wafer stage WST upon scanning exposure, and is expressed by a rotation error $\phi$ of the wafer coordinate system $(\alpha, \beta)$ with respect to a shot coordinate system having coordinate axes parallel to the $\alpha$- and $\beta$-axes.

⑥ Orthogonality of shot region: This is caused by distortion of a pattern formed on a reticle R, distortion (distortion error) of a projection optical system PL, and the like, and is expressed by an orthogonality error $\chi$.

⑦ Linear expansion/shrinkage of shot region: This is caused by an error of the projection magnification upon projecting a pattern formed on a reticle R onto a wafer W or by the wafer entirely or partially expanding or shrinking due to a formation process or the like. This expansion/shrinkage amount is expressed by wafer scaling values $r_X$ and $r_Y$ in the coordinate axis directions (i.e., $\alpha$- and $\beta$-directions) of the shot coordinate system. Note that the wafer scaling value $r_X$ in the $\alpha$-direction is represented by the ratio between the actually measured value and design value of the distance between two points in the $\alpha$-direction on the wafer W, and that the wafer scaling value $r_Y$ in the $\beta$-direction is represented by the ratio between the actually measured value and design value of the distance between two points in the $\beta$-direction.

The ideal position (DX, DY) in a shot area is expressed by $$DX = CX + SX \quad (47)$$

$$DY = CY + SY \quad (48)$$

using a central coordinate position (CX, CY) of that shot region, and a coordinate position (SX, SY) of the position (DX, DY) relative to that coordinate position (CX, CY) on the shot coordinate system. Therefore, when error factors ⑤ to ⑦ are added to the aforementioned error factors ① to ④, a pattern to be transferred at the ideal position (DX, DY) on the wafer coordinate system (α, β) is transferred to a position (EX, EY) on the stage coordinate system (X, Y) given by $$\begin{pmatrix} EX \\ EY \end{pmatrix} = \begin{pmatrix} R_X, 0 \\ 0, R_Y \end{pmatrix} \begin{pmatrix} \cos\theta, & -\sin\theta \\ \sin\theta, & \cos\theta \end{pmatrix} \begin{pmatrix} 1, & -\tan w \\ 0, & 1 \end{pmatrix} \begin{pmatrix} CX \\ CY \end{pmatrix} + \begin{pmatrix} r_X, 0 \\ 0, r_Y \end{pmatrix} \begin{pmatrix} \cos\phi, & -\sin\phi \\ \sin\phi, & \cos\phi \end{pmatrix} \begin{pmatrix} 1, & -\tan\chi \\ 0, & 1 \end{pmatrix} \begin{pmatrix} SX \\ SY \end{pmatrix} + \begin{pmatrix} O_X \\ O_Y \end{pmatrix} \quad (49)$$

Note that various other error factors are also present in addition to the aforementioned ones upon actual transfer, and that the position (EX, EY) is considered as an expected transfer position.

In general, since the orthogonality errors w and χ, and residual rotation errors θ and φ can be considered as infinitesimal amounts, the designed transfer position (DX, DY) and expected transfer position (EX, EY) are related by $$\begin{pmatrix} EX \\ EY \end{pmatrix} = \begin{pmatrix} R_X, & -R_X(w+\theta) \\ R_Y \cdot \theta, & R_Y \end{pmatrix} \begin{pmatrix} CX \\ CY \end{pmatrix} + \begin{pmatrix} r_X, & -r_X(\chi+\phi) \\ r_Y \cdot \phi, & r_X \end{pmatrix} \begin{pmatrix} SX \\ SY \end{pmatrix} + \begin{pmatrix} O_X \\ O_Y \end{pmatrix} \quad (50)$$

which expresses a first-order approximation of the trigonometric function in equation (49).

In the following description, equation (50) is also expressed by $$\begin{pmatrix} EX \\ EY \end{pmatrix} = \begin{pmatrix} A_{11}, & A_{12} \\ A_{21}, & A_{22} \end{pmatrix} \begin{pmatrix} CX \\ CY \end{pmatrix} + \begin{pmatrix} B_{11}, & B_{12} \\ B_{21}, & B_{22} \end{pmatrix} \begin{pmatrix} SX \\ SY \end{pmatrix} + \begin{pmatrix} O_X \\ O_Y \end{pmatrix} \quad (51)$$

where $$B_{11} = r_X \quad (52)$$

$$B_{12} = -r_X(\chi+\phi) \quad (53)$$

$$B_{21} = r_Y \cdot \phi \quad (54)$$

$$B_{22} = r_Y \quad (55)$$

Figure 14:
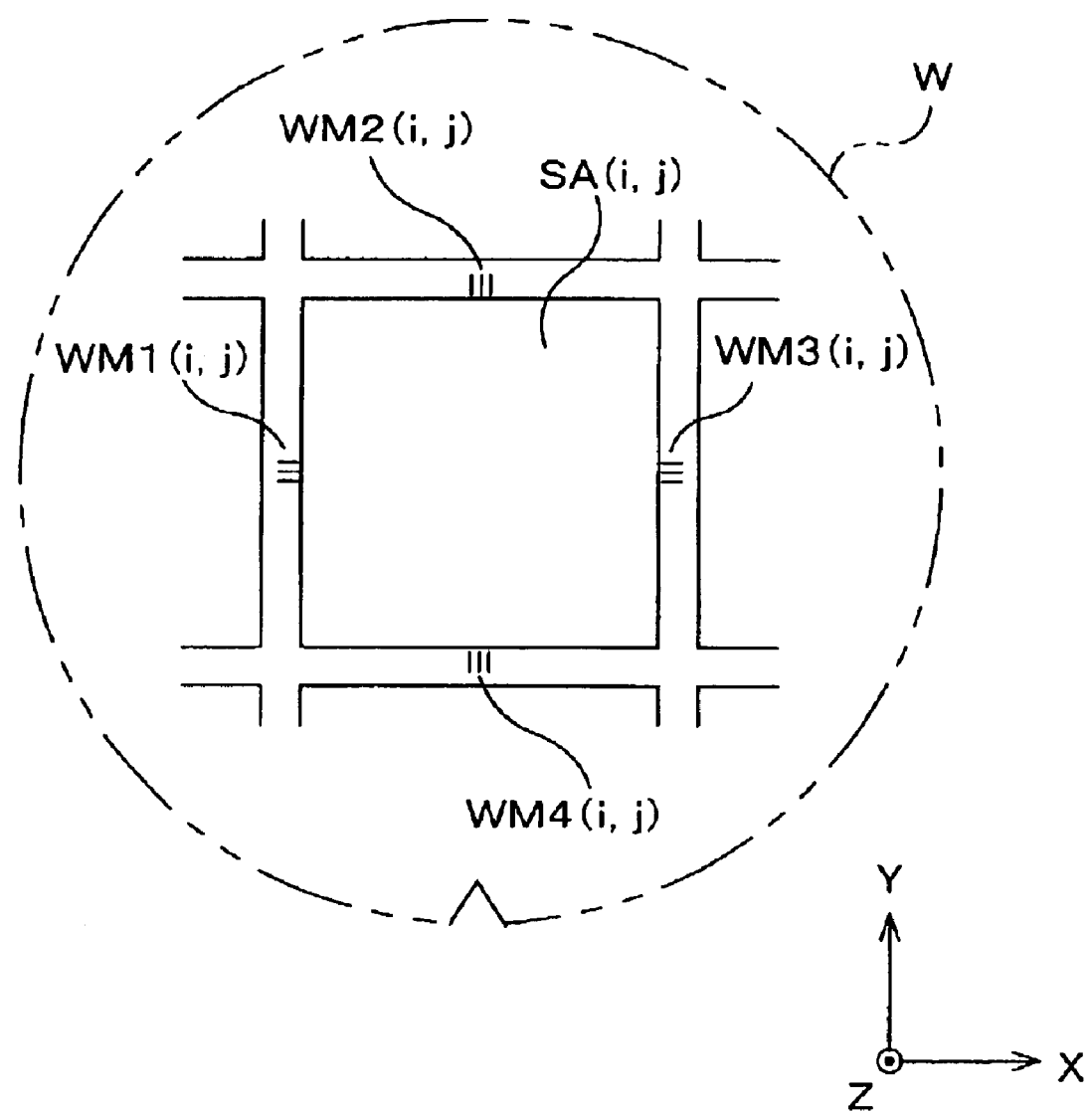
FIG. 14 is a view for explaining another modification (No. 2)
Figure 15A:
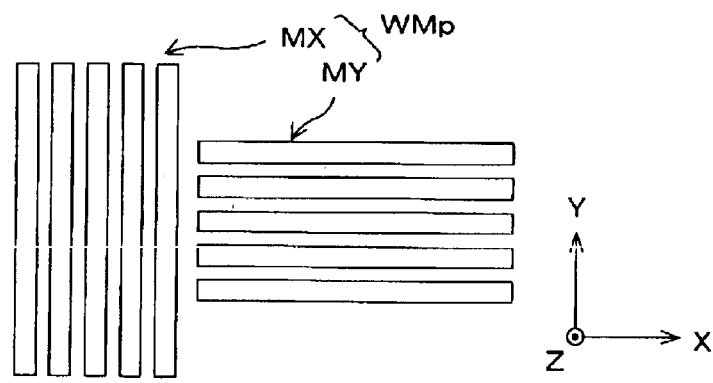
FIGS. 15A to 15D are views showing exemplary patterns of two-dimensional marks used in the modification (No. 2).
Figure 15B:
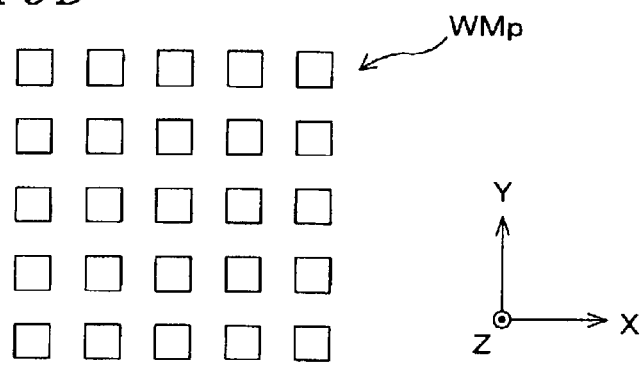
Figure 15C:
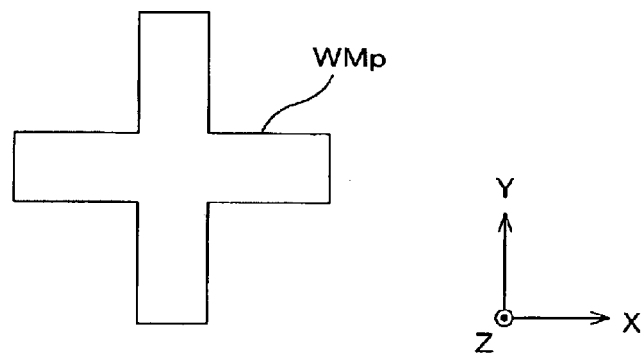
Figure 15D:
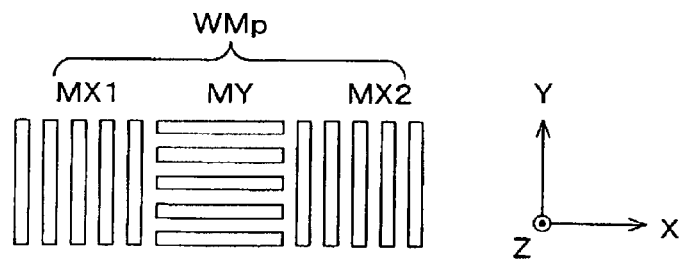

That is, parameters which uniquely specify the arrangement of shot areas SA(i, j) are ten parameters $A_{11}, A_{12}, A_{21}, A_{22}, B_{11}, B_{12}, B_{21}, B_{22}, O_X$, and $O_Y$. In order to obtain optimal values of the ten parameters, four two-dimensional marks WMp(i, j) (p=1 to 4), which do not line up upon design and the patterns of which change in the X- and Y-directions, are formed on each shot area SA(i, j), as shown in, e.g., FIG. 14. Note that the number of wafer marks is not limited to four, and can be three or more. As the two-dimensional marks WMp, marks having patterns shown in, e.g., FIGS. 15A to 15D, can be used.

Then, more than five two-dimensional marks WMp($i_m$, $j_m$) (m>5) including three out of four two-dimensional marks WMp(i, j) on any shot area are measured. After that, the X- and Y-positions of the two-dimensional marks WMp($i_m$, $j_m$), and the probability densities of those X- and Y-positions are calculated in the same manner as in the above embodiment, thus calculating optimal values of the ten parameters $A_{11}, A_{12}, A_{21}, A_{22}, B_{11}, B_{12}, B_{21}, B_{22}, O_X$, and $O_Y$.

In this way, the arrangement of shot areas can be obtained that takes into account the rotation, orthogonality and expansion/shrinkage of each shot region Furthermore, optimal values of the error factors ($r_X$, $r_Y$, χ, φ|) are calculated using equations (32) to (35) for the aforementioned controllable error factors ($r_X$, $r_Y$, χ, φ) and four parameters ($B_{11}$, $B_{12}$, $B_{21}$, $B_{22}$) of the ten parameters, the optimal values of which have been calculated, and in accordance with those error factors, corrected are the magnification of the projection optical system PL, the synchronous velocity ratio upon scanning exposure, synchronous moving directions upon scanning exposure, and the like. Thus, the accuracy of superposition is further improved.

In the above embodiment, a plurality of initial sample sets are used, but if one sample set from which accurate position parameters can be calculated is known, that sample set may be used as only one initial sample set. Even in such a case, the processing flow of the above embodiment can be applied. Since the number of sample sets is one from the beginning, in the processing flow of the above embodiment, the answer in step 204 is always NO.

In the above embodiment, whether or not it is possible to reduce the number of elements of a sample set is evaluated by comparing the position parameter values and their certainties calculated from the sample set, and estimations of position parameters and their certainties calculated from each of a plurality of replacement candidate sets. Alternatively, such evaluation can be performed by so-called cross-verification.

More specifically, the position errors of marks MX and MY included in a sample set are calculated using the estimations of the position parameters calculated for each replacement candidate set, and the position error distribution of the marks MX and MY included in the sample set is calculated based on that calculation result, thus evaluating if each replacement candidate set has statistical characteristics equivalent to that of the sample set. In this case, replacement possibility can be evaluated without calculating the position parameter values and their certainties from the sample set. Such cross-verification is particularly effective when the replacement candidate set is a subset of the sample set.

In the above embodiment, upon reducing the number of elements of a sample set, a plurality of initial sample sets are replaced by one new sample set. Alternatively, the number of elements of each of the plurality of initial sample sets may be reduced. In this case, for each sample set, a new sample set is searched for that has characteristics equivalent thereto in the statistical characteristics of position errors of marks and consists of fewer elements.

In the above embodiment, one-dimensional marks MX and MY are used. Alternatively, two-dimensional marks shown in FIGS. 15A to 15D may be used. Also, upon calculating the ten parameters, one-dimensional marks MX and MY may be used. As the two-dimensional mark, for example, a box-in-box mark may be used in addition to those shown in FIGS. 15A to 15D. Upon detecting the two-dimensional position of such a two-dimensional mark, the aforementioned one-dimensional position detection process may be performed twice, or two-dimensional template matching into which the above one-dimensional template matching for one-dimensional signals is extended may be performed on two-dimensional signal waveforms of two-dimensional marks.

In the above embodiment, the off-axis alignment method that measures the positions of alignment marks on a wafer without the intervention of a projection optical system is adopted. Alternatively, a TTL (through-the-lens) scheme that measures the positions of alignment marks on a wafer via a projection optical system, or a TTR (through-thereticle) that simultaneously observes a wafer and reticle via a projection optical system may be adopted. In the case of the TTR scheme, upon observation, sample alignment senses the position of a wafer mark where the deviation between a reticle mark formed on the reticle and a wafer mark formed on the wafer is zero.

In the above embodiment, the coordinate positions of the shot areas are calculated. Alternatively, the step pitch of each shot may be calculated.

In the above embodiment, the fly-eye lens is used as an optical Integrator (homogenizer In place of the fly-eye lens, a rod integrator may be used. In an illumination optical system using the rod integrator, the rod integrator is disposed such that its exit surface is nearly conjugated with the pattern surface of a reticle R. Such an illumination optical system using the rod integrator is disclosed in, e.g., U.S. Pat. No. 5,675,401, and the disclosures in the above U.S. patent is incorporated herein by reference as long as the national laws in designated states or elected states, to which this international application is applied, permit. Also, the fly-eye lens and rod integrator may be combined, or two fly-eye lenses or rod integrators may be disposed in series to build double optical integrators.

In the above embodiment, the present invention is applied to the step-and-scan scanning exposure apparatus. However, the application range of the present invention is not limited to such specific apparatus, and the present invention can be suitably applied to a stationary exposure apparatus such as a stepper or the like.

Even an exposure apparatus using, e.g., ultraviolet rays may adopt as a projection optical system a reflection system consisting of reflective optical elements alone or a reflection/refraction system (a catadioptric system) having both reflective and refractive optical elements. As the catadioptric projection optical system, a reflection/refraction system which is disclosed in, e.g., Japanese Patent Laid-Open No. 8-171054 and corresponding U.S. Pat. No. 5,668,672, Japanese Patent Laid-Open No. 10-20195 and corresponding U.S. Pat. No. 5,835,275, and the like, and has a beam splitter and concave mirror as reflection optical elements, or a reflection/refraction system which is disclosed in Japanese Patent Laid-Open No. 8-334695 and corresponding U.S. Pat. No. 5,689,377, Japanese Patent Laid-Open No. 10-3039 and corresponding U.S. patent application Ser. No. 873,605 (application date: Jun. 12, 1997), and the like, and has a concave mirror and the like as reflective optical elements without using any beam splitter can be used. The disclosures in the above Japanese Patent Laid-Opens and U.S. patents are incorporated herein by reference as long as the national laws in designated states or elected states, to which this international application is applied, permit.

In addition, a reflection/refraction system can be employed which comprises a plurality of refraction optical elements and two mirrors (a main mirror being a concave mirror and a sub-mirror that is a back surface mirror of which the reflection surface is formed on the opposite side to the incident surface of a refraction element or plane parallel plate) that are disposed along one axis, and has the intermediate image, formed by those refraction optical elements, of a reticle pattern again imaged on a wafer using the main mirror and sub-mirror, the reflection/refraction system being disclosed in Japanese Patent Laid-Open No. 10-104513 and U.S. Pat. No. 5,488,229 corresponding thereto. In this reflection/refraction system, the main mirror and sub-mirror are disposed in series with the plurality of refraction optical elements, and an illumination light passes through a portion of the main mirror, is reflected by the sub-mirror and the main mirror in turn, passes through a portion of the sub-mirror and reaches the wafer. The disclosures in the above Japanese Patent Laid-Open and U.S. patent are incorporated herein by reference as long as the national laws in designated states or elected states, to which this international application is applied, permit.

Furthermore, as the reflection/refraction-type projection optical system, a reduction system may be employed which has, e.g., a circular image field, is telecentric on both the object plane side and image plane side, and has a reduction ratio of, e.g., 1/4 or 1/5. Also, in a scanning exposure apparatus comprising this reflection/refraction-type projection optical system, the illumination area of the illumination light may be a rectangular-slit-shaped area whose center almost coincides with the optical axis of the projection optical system and which extends along a direction almost perpendicular to the scanning direction of a reticle or wafer. By using a scanning exposure apparatus comprising such a reflection/refraction-type projection optical system, it is possible to accurately transfer a fine pattern of about 100 nm L/S pattern onto wafers even with $F_2$ laser light having, for example, the wavelength of 157 nm as exposure light.

Furthermore, as a vacuum ultraviolet light, ArF excimer laser light or $F_2$ laser light is used. However, in a case of containing only a beam-monitor mechanism and reference wavelength light source in the same environment-controlled chamber as the projection optical system, a higher harmonic wave may be used which is obtained with wavelength conversion into ultraviolet by using non-linear optical crystal after having amplified a single wavelength laser light, infrared or visible, emitted from a DFB semiconductor laser device or a fiber laser by a fiber amplifier having, for example, erbium (or erbium and ytterbium) doped.

For example, considering that the oscillation wavelength of a single wavelength laser is in the range of 1.51 to 1.59 um, an eight-time-higher harmonic wave of which the wavelength is in the range of 189 to 199 nm or a ten-time-higher harmonic wave of which the wavelength is in the range of 151 to 159 nm is emitted. Especially, when the oscillation wavelength is in the range of 1.544 to 1.553 um, an eight-time-higher harmonic wave of which the wavelength is in the range of 193 to 194 nm, that is, almost the same as ArF excimer laser light (ultraviolet light) is obtained, and when the oscillation wavelength is in the range of 1.57 to 1.58 um, a ten-time-higher harmonic wave of which the wavelength is in the range of 157 to 158 nm, that is, almost the same as $F_2$ laser light (ultraviolet light) is obtained.

Furthermore, when the oscillation wavelength is in the range of 1.03 to 1.12 um, a seven-time-higher harmonic wave of which the wavelength is in the range of 147 to 160 nm is emitted, and, especially, when the oscillation wavelength is in the range of 1.099 to 1.106 um, a seven-time-higher harmonic wave of which the wavelength is in the range of 157 to 158 nm, that is, almost the same as $F_2$ laser light (ultraviolet light) is obtained. In this case, for example, ytterbium-doped fiber laser can be employed as the single wavelength laser.

Moreover, the present invention can be applied not only to an exposure apparatus for producing micro devices such as semiconductor devices but also to an exposure apparatus that transfers a circuit pattern onto a glass substrate or silicon wafer so as to produce reticles or masks used by a light exposure apparatus, EUV (Extreme Ultraviolet) exposure apparatus, X-ray exposure apparatus, electron beam exposure apparatus, etc. Incidentally, in an exposure apparatus using DUV (far ultraviolet) light or VUV (vacuum ultraviolet) light, a transmission-type reticle is employed in general. And as the substrate of the reticle, quartz glass, quartz glass with fluorine doped, fluorite, magnesium fluoride, or quartz crystal is employed. And an X-ray exposure apparatus of a proximity method or electron beam exposure apparatus employs a transmission-type mask (stencil-mask, membrane-mask); an EUV exposure apparatus employs a reflection-type mask, and as the substrate of the mask, silicon wafer or the like is employed.

Note that the present invention can be applied not only to a wafer exposure apparatus used in the production of semiconductor devices but also to an exposure apparatus that transfers a device pattern onto a glass plate and is used in the production of displays such as liquid crystal display devices and plasma displays, an exposure apparatus that transfers a device pattern onto a ceramic plate and is used in the production of thin magnetic heads, and an exposure apparatus used in the production of pick-up devices (CCD, etc.). In addition, in the above embodiment, positional detection of the alignment marks on a wafer and alignment of the wafer have been described. However, positional detection and alignment according to the present invention can be applied to positional detection of the alignment marks on a reticle and alignment of the reticle, and also to other units than exposure apparatuses such as a unit to observe objects and a unit that is used to detect positions of objects and align them in an assembly line, process line or inspection line.

As has been described in detail above, according to the position detection method and position detection apparatus of the present invention, since a statistical process is executed on the basis of position information of position detection points obtained by measurement of the position detection points on an object, position information of any area on the object is accurately and efficiently detected. Therefore, the position detection method and position detection apparatus of the present invention are suitable for detecting the position of any area on an object.

Also, according to the exposing method and exposure apparatus of the present invention, the positions of a predetermined number of alignment marks formed on a substrate are detected using the position detection method of the present invention, and a predetermined pattern is transferred onto divided areas while aligning the substrate on the basis of the detection result. Therefore, the exposing method and exposure apparatus of the present invention are suitable to perform multi-exposure for forming a multi-layer pattern with improved accuracy of superposition between layers. For this reason, the exposing method and exposure apparatus of the present invention are suitable for mass-production of devices having a fine pattern.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A position detection method for detecting position information of any area on an object provided with a first number of position-measurement-points, the position detection method comprising:

selecting, from the first number of position-measurement-points, a plurality of measurement point subsets which each include a third number of any position-measurement-points, and each subset respectively having different combination of the position-measurement-points, the third number being larger than a second number and smaller than the first number, the second number being a minimum number of measurement points required to calculate a predetermined number of parameters that uniquely specify position information of any area on the object;

measuring position information of the position-measurement-points included in the plurality of measurement point subsets;

statistically calculating, for each of the plurality of measurement point subsets, estimations of the predetermined number of parameters and certainty of the estimations, based on measurement results of the third number of any position-measurement-points;

determining the parameters, based on the estimations of the predetermined number of parameters calculated for each of the plurality of measurement point subsets and the certainty of the estimations calculated for each of the plurality of measurement point subsets; and calculating the position information of any area on the object, using the determined parameters.

2. The position detection method according to claim 1, further comprising:

obtaining statistically valid values of the predetermined number of parameters, based on the respective groups of estimations and certainty for the plurality of measurement point subsets calculated in the step of statistically calculating.

3. The position detection method according to claim 2, wherein the statistically valid value of each of the predetermined number of parameters is obtained by calculating average of the corresponding estimations weighted with the respective certainties, each of the certainties representing a piece of weight information for the respective estimation.

4. The position detection method according to claim 1, wherein the step of statistically calculating comprises:

calculating, for each of the plurality of measurement point subsets, respective positions of the third number of position-measurement-points based on the measurement results of the third number of any position-measurement-points and estimating probability density functions that each represent occurrence probability that the calculated position is to be a predetermined value of the respective, selected third number of any position-measurement-points;

calculating respective probability densities of the calculated positions of the position-measurement-points, based on the probability density functions; and evaluating an error of each of the calculated positions relative to respective reference position using the respective calculated probability density's value as a piece of weight information and calculating estimations of the predetermined number of parameters, based on the evaluated errors.

5. The position detection method according to claim 1, wherein position measurement marks are formed at all of the position-measurement-points.

6. The position detection method according to claim 5, wherein a plurality of divided areas, each of which is provided with the position measurement marks, are arranged on the object.

7. The position detection method according to claim 1, wherein the step of selecting comprises:
- selecting, from the first number of position-measurement-points, a first measurement point subset which includes the third number of position-measurement-points, and
- selecting, from the first measurement point subset, a plurality of second measurement point subsets which each include a fourth number of any position-measurement-points and each subset respectively having different combination of the position-measurement-points, the fourth number being larger than the second number and smaller than the third number;
- in the step of measuring measuring position information of the position-measurement-points included in the first measurement point subset; and
- in the step of statistically calculating, statistically evaluating a possibility of replacing the first measurement point subset by one of the plurality of second measurement point subsets, based on measurement results of the third number of position-measurement-points composing the first measurement point subset and measurement results of sets of the fourth number of any position-measurement-points each composing one of the second measurement point subsets, the first measurement point subset being used to calculate the predetermined number of parameters, and in the step of statistically evaluating, evaluating similarities between a predetermined feature amount of the first measurement point subset and a predetermined feature amount of the second measurement point subsets respectively obtained based on each of the measurement results, the predetermined feature amount of the second measurement point subsets being same kind feature amount as the predetermined feature amount of the first measurement point subset.

8. The position detection method according to claim 7, wherein the step of evaluating comprises:
- statistically calculating estimations of the predetermined number of parameters and certainty of the estimations, based on measurement results of the third number of position-measurement-points composing the first measurement point subset;
- statistically calculating estimations of the predetermined number of parameters and certainty of the estimations for each of the plurality of second measurement point subsets, based on measurement results of the fourth number of position-measurement-points; and
- comparing the estimations and certainty of the first measurement point subset with the estimations and certainty for each of the plurality of second measurement point subsets and evaluating possibility of replacing the first measurement point subset by one of the plurality of second measurement point subsets, the first measurement point subset being used to calculate the predetermined number of parameters.

9. The position detection method according to claim 8, wherein in the step of calculating estimations for the first measurement point subset, certainties of position measurement results of the position-measurement-points are taken into account upon calculating the estimations and certainty thereof.

10. The position detection method according to claim 9, wherein the step of calculating estimations for the first measurement point subset comprises:
- calculating respective positions of the third number of position-measurement-points, which compose the first measurement point subset, based on measurement results of the third number of position-measurement-points and estimating probability density functions that each represent occurrence probability of the calculated position of a respective point of the third number of position-measurement-points;
- calculating respective probability densities of the calculated positions of the position-measurement-points, based on the probability density functions; and
- evaluating an error of each of the calculated positions relative to respective reference position using the respective calculated probability density's value as a piece of weight information and calculating estimations of the predetermined number of parameters, based on the evaluated errors.

11. The position detection method according to claim 8, wherein in the step of calculating estimations for each second measurement point subset, certainties of position measurement results of the position-measurement-points are taken into account upon calculating the estimations and certainty thereof.

12. The position detection method according to claim 11, wherein the step of calculating estimations for each second measurement point subset comprises:
- calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points;
- calculating respective probability densities of the calculated positions of the position-measurement-points, based on the probability density functions; and
- evaluating an error of each of the calculated positions relative to respective reference position using the respective calculated probability density's value as a piece of weight information and calculating estimations of the predetermined number of parameters, based on the evaluated errors.

13. The position detection method according to claim 7, wherein the step of evaluating comprises:
- statistically calculating, for each of the second measurement point subsets, estimations of the predetermined number of parameters and certainty of the estimations, based on measurement results of the fourth number of position-measurement-points;
- statistically calculating position errors of the position-measurement-points of the first measurement point subset through use of the estimations of the predetermined number of parameters calculated in the step of calculating estimations and evaluating possibility of replacing the first measurement point subset by one of the plurality of second measurement point subsets.

14. The position detection method according to claim 13, wherein in the step of calculating estimations, certainties of position measurement results of the position-measurement-points are taken into account upon calculating the estimations and certainty thereof.

15. The position detection method according to claim 14, wherein the step of calculating estimations comprises:
- calculating respective positions of the fourth number of position-measurement-points, for each of the plurality of second measurement point subsets, based on measurement results of the fourth number of positionmeasurement-points and estimating probability density functions that each represent occurrence probability of the calculated position of a respective point of the fourth number of position-measurement-points;

calculating respective probability densities of the calculated positions of the position-measurement-points, based on the probability density functions; and evaluating an error of each of the calculated positions relative to respective reference position using the respective calculated probability density's value as a piece of weight information and calculating estimations of the predetermined number of parameters, based on the evaluated errors.

16. The position detection method according to claim 7, further comprising a step which, when the step of evaluating finds second measurement point subsets that can replace the first measurement point subset, selects a most valid subset from the second measurement point subsets for replacement and adopts estimations of the predetermined number of parameters, calculated based on measurement results of the fourth number of position-measurement-points of the selected second measurement point subset, as values thereof, and which, when the step of evaluating finds no second measurement point subsets that can replace the first measurement point subset, adopts estimations of the predetermined number of parameters, calculated based on measurement results of the second number of position-measurement-points of the first measurement point subset, as values thereof.

17. The position detection method according to claim 7, wherein position measurement marks are formed at the position-measurement-points.

18. The position detection method according to claim 17, wherein a plurality of divided areas, each of which is provided with the position measurement marks, are arranged on the object.

19. The position detection method according to claim 1, wherein the step of selecting comprises:

selecting, from the first number of position-measurement-points, a plurality of first measurement point subsets which each include the third number of position-measurement-points and each subset respectively having different combination of the position-measurement-points, and selecting, from the plurality of the first measurement point subsets, a plurality of second measurement point subsets which each include a fourth number of any position-measurement-points and each subset respectively having different combination of the position-measurement-points, the fourth number being larger than the second number and smaller than the third number;

in the step of measuring, measuring position information of a plurality of position-measurement-points included in the plurality of the first measurement point subsets; and in the step of statistically calculating, statistically evaluating, based on measurement results of the position-measurement-points included in the plurality of the first measurement point subsets, a possibility of replacing the plurality of first measurement point subsets by one of the plurality of second measurement point subsets, as a measurement point set used to calculate the predetermined number of parameters.

20. The position detection method according to claim 19, wherein the step of evaluating comprises:

statistically calculating, for each of the plurality of first measurement point subsets, estimations of the predetermined number of parameters and certainty of the estimations, based on measurement results of the third number of position-measurement-points;

calculating statistically valid estimations of the predetermined number of parameters and certainty of the estimations, based on groups of the estimations and certainty thereof for the plurality of first measurement point subsets, calculated in the step of calculating estimations for each first measurement point subset;

statistically calculating estimations of the predetermined number of parameters and certainty of the estimations for each of the plurality of second measurement point subsets, based on measurement results of the fourth number of position-measurement-points; and comparing the statistically valid estimations and certainty with the estimations and certainty for each of the plurality of second measurement point subsets and evaluating possibility of adopting one of the plurality of second measurement point subsets as a measurement point set used to calculate the predetermined number of parameters.

21. The position detection method according to claim 20, wherein in the step of calculating estimations for each first measurement point subset, certainties of position measurement results of the position-measurement-points are taken into account upon calculating the estimations and certainty thereof.

22. The position detection method according to claim 21, wherein the step of calculating estimations for each first measurement point subset comprises:

calculating respective positions of the third number of position-measurement-points, for each of the plurality of first measurement point subsets, based on measurement results of the third number of position-measurement-points and estimating probability density functions that each represent occurrence probability of the calculated position of a respective point of the third number of position-measurement-points;

calculating respective probability densities of the calculated positions of the position-measurement-points, based on the probability density functions; and evaluating an error of each of the calculated positions relative to respective reference position using the respective calculated probability density's value as a piece of weight information and calculating estimations of the predetermined number of parameters, based on the evaluated errors.

23. The position detection method according to claim 20, wherein in the step of calculating estimations for each second measurement point subset, certainties of position measurement results of the position-measurement-points are taken into account upon calculating the estimations and certainty thereof.

24. The position detection method according to claim 23, wherein the step of calculating estimations for each second measurement point subset comprises:

calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points;

calculating respective probability densities of the calculated positions of the position-measurement-points, based on the probability density functions; and evaluating an error of each of the calculated positions relative to respective reference position using the respective calculated probability density's value as a piece of weight information and calculating estimations of the predetermined number of parameters, based on the evaluated errors.

25. The position detection method according to claim 20, further comprising a step which, when the step of evaluating finds second measurement point subsets that can replace the first measurement point subset, selects a most valid subset from the second measurement point subsets for replacement and adopts estimations of the predetermined number of parameters, calculated based on measurement results of the fourth number of position-measurement-points of the selected second measurement point subset, as values thereof, and which, when the step of evaluating finds no second measurement point subsets that can replace the first measurement point subset, adopts the statistically valid estimations as values of the predetermined number of parameters.

26. The position detection method according to claim 19, wherein the step of evaluating comprises:

statistically calculating, for each of the second measurement point subsets, estimations of the predetermined number of parameters and certainty of the estimations, based on measurement results of the fourth number of position-measurement-points;

calculating position errors of all the position-measurement-points of the plurality of first measurement point subsets through use of the estimations of the predetermined number of parameters calculated for each of the second measurement point subsets and evaluating possibility of replacing the plurality of first measurement point subsets by one of the plurality of second measurement point subsets.

27. The position detection method according to claim 26, wherein in the step of calculating estimations for each second measurement point subset, certainties of position measurement results of the position-measurement-points are taken into account upon calculating the estimations and certainty thereof.

28. The position detection method according to claim 27, wherein the step of calculating estimations for each second measurement point subset comprises:

calculating respective positions of the fourth number of position-measurement-points, for each of the plurality of second measurement point subsets, based on measurement results of the fourth number of position-measurement-points and estimating probability density functions that each represent occurrence probability of the calculated position of a respective point of the fourth number of position-measurement-points;

calculating respective probability densities of the calculated positions of the position-measurement-points, based on the probability density functions; and evaluating an error of each of the calculated positions relative to respective reference position using the respective calculated probability density's value as a piece of weight information and calculating estimations of the predetermined number of parameters, based on the evaluated errors.

29. The position detection method according to claim 19, further comprising a step which, when the step of evaluating finds second measurement point subsets that can replace the first measurement point subset, selects a most valid one, for replacement, of the second measurement point subsets and adopts estimations of the predetermined number of parameters, calculated based on measurement results of the fourth number of position-measurement-points of the selected second measurement point subset, as values thereof, and which, when the step of evaluating finds no second measurement point subsets that can replace the first measurement point subset, statistically calculates estimations of the predetermined number of parameters and certainty of the estimations, based on measurement results of the third number of position-measurement-points for each of the plurality of first measurement point subsets, and adopts as values of the predetermined number of parameters statistically valid estimations thereof calculated based on groups of the estimations and certainty thereof for the plurality of first measurement point subsets.

30. The position detection method according to claim 29, wherein the statistically valid value of each of the predetermined number of parameters is obtained by calculating average of the corresponding estimations weighted with the respective certainties, each of the certainties representing a piece of weight information for the respective estimation.

31. The position detection method according to claim 19, wherein position measurement marks are formed at the position-measurement-points.

32. The position detection method according to claim 31, wherein a plurality of divided areas each of which is provided with the position measurement marks are arranged on the object.

33. An exposure method for transferring a predetermined pattern onto divided areas on a substrate, comprising:

calculating a predetermined number of parameters that pertain to positions of the divided areas by a position detection method according to claim 1 and calculating arrangement information of the divided areas on the substrate; and transferring the pattern onto the divided areas while aligning the substrate based on the arrangement information of the divided areas calculated in the step of calculating arrangement information.

34. A device manufacturing method including a lithography process, wherein the lithography process transfers a predetermined pattern onto divided areas on a substrate using an exposure method according to claim 33.

35. An exposure method for transferring a predetermined pattern onto divided areas on a substrate, comprising:

calculating a predetermined number of parameters that pertain to positions of the divided areas by a position detection method according to claim 7 and calculating arrangement information of the divided areas on the substrate; and transferring the pattern onto the divided areas while aligning the substrate based on the arrangement information of the divided areas calculated in the step of calculating arrangement information.

36. A device manufacturing method including a lithography process, wherein the lithography process transfers a predetermined pattern onto divided areas on a substrate using an exposure method according to claim 35.

37. An exposure method for transferring a predetermined pattern onto divided areas on a substrate, comprising:

calculating a predetermined number of parameters that pertain to positions of the divided areas by a position detection method according to claim 19 and calculating arrangement information of the divided areas on the substrate; and transferring the pattern onto the divided areas while aligning the substrate based on the arrangement information of the divided areas calculated in the step of calculating arrangement information.

38. A device manufacturing method including a lithography process, wherein the lithography process transfers a predetermined pattern onto divided areas on a substrate using an exposure method according to claim 37.

39. A position detector that detects position information of any area on an object provided with a first number of position-measurement-points, the position detector comprising:

a set-selection unit that selects, from the first number of position-measurement-points, a plurality of measurement point subsets which each include a third number of any position-measurement-points and each subset respectively having different combination of the position-measurement-points, the third number being larger than a second number and smaller than the first number, the second number being a minimum number of measurement points required to calculate a predetermined number of parameters that uniquely specify position information of any area on the object;

a measurement unit that measures positions of the position-measurement-points included in the plurality of measurement point subsets;

an estimation computing unit that is electrically connected to the measurement unit and the set-selection unit and that statistically calculates, for each of the plurality of measurement point subsets, estimations of the predetermined number of parameters and certainty of the estimations, based on measurement results of the third number of any position-measurement-points;

a determining unit that is electrically connected to the estimation computing unit and that determines the parameters, based on the estimations of the predetermined number of parameters calculated for each of the plurality of measurement point subsets and the certainty of the estimations calculated for each of the plurality of measurement point subsets; and a position calculating unit that is electrically connected to the determining unit and that calculates the position information of any area on the object, using the determined parameters.

40. The position detector according to claim 39, wherein the estimation computing unit comprising:

an estimation unit that, for each of the plurality of measurement point subsets, detects respective positions of the third number of position-measurement-points, based on the measurement results of the pieces of position information of the third number of position-measurement-points, estimates probability density functions which each represent occurrence probability of the detected position for the respective point of the third number of position-measurement-points, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors.

41. The position detector according to claim 39, further comprising:

a parameter value determining unit that is electrically connected to the estimation computing unit and that calculates statistically valid estimations of the predetermined number of parameters based on groups of the estimations and certainty thereof, calculated by the estimation computing unit, for the plurality of measurement point subsets.

42. The position detector according to claim 39, wherein the set-selection unit selects, from the first number of position-measurement-points, a first measurement point subset which includes the third number of position-measurement-points, and, from the first measurement point subset, a plurality of second measurement point subsets which each include a fourth number of any position-measurement-points and each subset respectively having different combination of the position-measurement-points, the fourth number being larger than the second number and smaller than the third number;

the measurement unit measures positions of the position-measurement-points included in the first measurement point subset; and the estimation computing unit comprises:

an evaluation computing unit that is electrically connected to the set-selection unit and the measurement unit, and that statistically evaluates a possibility of replacing the first measurement point subset by one of the plurality of second measurement point subsets, based on measurement results of the third number of position-measurement-points included in the first measurement point subset and the measurement results of the fourth number of any position-measurement points included respectively in one of the plurality of second measurement subsets, the first measurement point subset being used to calculate the predetermined number of parameters, and in the step of statistical evaluation, the evaluation computing unit evaluates similarities between a predetermined feature amount of the first measurement point subset and a predetermined feature amount of the second measurement point subsets respectively obtained based on each of the measurement results, the predetermined feature amount of the second measurement point subsets being same kind feature amount as the predetermined feature amount of the first measurement point subset.

43. The position detector according to claim 42, wherein the evaluation computing unit comprises:

an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the first measurement point subset and the plurality of second measurement point subsets; and an evaluation unit that is electrically connected to the estimation calculation unit and that compares the estimations and certainty of the first measurement point subset with the estimations and certainty for each of the plurality of second measurement point subsets and evaluates possibility of replacing the first measurement point subset by one of the plurality of second measurement point subsets, the first measurement point subset being used to calculate the predetermined number of parameters.

44. The position detector according to claim 43, wherein the estimation calculation unit comprises:

an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors.

45. The position detector according to claim 42, wherein the evaluation computing unit comprises:

an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset, which is selected from the plurality of second measurement point subsets; and an evaluation unit that is electrically connected to the estimation calculation unit and that calculates position errors of the position-measurement-points, composing the first measurement point subset, through use of estimations of the predetermined number of parameters for each of the plurality of second measurement point subsets and evaluates possibility of replacing the first measurement point subset by one of the plurality of second measurement point subsets.

46. The position detector according to claim 45, wherein the estimation calculation unit comprises:

an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors.

47. The position detector according to claim 42, further comprising a parameter value determining unit that is electrically connected to the evaluation computing unit and that calculates values of the predetermined number of parameters, based on evaluation results of the evaluation computing unit.

48. The position detector according to claim 39, wherein the set-selection unit selects, from the first number of position-measurement-points, a plurality of first measurement point subsets which each includes the third number of position-measurement-points and each subset respectively having different combination of the position-measurement-points, and from the plurality of the first measurement point subsets, a plurality of second measurement point subsets which each include a fourth number of any position-measurement-points and each subset respectively having different combination of the position-measurement-points, the fourth number being larger than the second number and smaller than the third number;

the measurement unit measures positions of the position-measurement-points included in the plurality of the first measurement point subsets; and the estimation computing unit comprises:

an evaluation computing unit that is electrically connected to the set-selection unit and the measurement unit, and that statistically evaluates, based on measurement results of any position-measurement-points included in the plurality of the first measurement point subsets, a possibility of adopting one of the plurality of second measurement point subsets as a measurement point subset to calculate the predetermined number of parameters.

49. The position detector according to claim 48, wherein the evaluation computing unit comprises:

an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the plurality of first measurement point subset and the plurality of second measurement point subsets, and calculates statistically valid estimations of the predetermined number of parameters and certainty of the estimations, based on groups of estimations of the predetermined number of parameters and certainty of the estimations for the plurality of first measurement point subsets; and an evaluation computing unit that is electrically connected to the estimation calculation unit and that compares the statistically valid estimations and certainty of the first measurement point subset with the estimations and certainty for each of the plurality of second measurement point subsets, and evaluates possibility of adopting one of the plurality of second measurement point subsets as a measurement point subset to calculate the predetermined number of parameters.

50. The position detector according to claim 49, wherein the estimation calculation unit comprises:

an estimation unit that is electrically connected to the measurement unit and that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors.

51. The position detector according to claim 48, wherein the evaluation computing unit comprises:

an estimation calculation unit that is electrically connected to the measurement unit and that statistically calculates, for the specific measurement point subset, estimations of the predetermined number of parameters and certainty of the estimations, based on measurement results of position information of position-measurement-points composing the specific measurement point subset which is selected from the plurality of second measurement point subsets; and an evaluation unit that is electrically connected to the estimation calculation unit and that calculates errors of all the position-measurement-points of the plurality of first measurement point subsets through use of the estimations of the predetermined number of parameters calculated for each of the second measurement point subsets, and evaluates possibility of replacing the plurality of first measurement point subsets by one of the plurality of second measurement point subsets.

52. The position detector according to claim 51, wherein the estimation calculation unit comprises:

an estimation unit that detects respective positions of position-measurement-points composing the specific measurement point subset, based on the measurement results of position information of position-measurement-points composing the specific measurement point subset, estimates probability density functions which each represent occurrence probability of the detected position for respective one of the position-measurement-points of the specific measurement point subset, and calculates probability density of the detected position of each of the position-measurement-points; and a parameter calculation unit that is electrically connected to the estimation unit and that evaluates detection error of each of the detected positions while using the respective calculated probability density's value as a piece of weight information and calculates such values of the predetermined number of parameters that the detection errors become statistically minimum as a whole, based on the detection errors.

53. The position detector according to claim 48, further comprising a parameter value determining unit that is electrically connected to the parameter calculation unit and that calculates values of the predetermined number of parameters, based on evaluation results of the evaluation computing unit.

54. An exposure apparatus that transfers a predetermined pattern onto divided areas on a substrate, comprising:

a stage unit that moves the substrate along a movement plane; and a position detector according to claim 39 that calculates arrangement information of the divided areas on the substrate mounted on the stage unit.

55. An exposure apparatus that transfers a predetermined pattern onto divided areas on a substrate, comprising:

a stage unit that moves the substrate along a movement plane; and a position detector according to claim 42 that calculates arrangement information of the divided areas on the substrate mounted on the stage unit.

56. An exposure apparatus that transfers a predetermined pattern onto divided areas on a substrate, comprising:

a stage unit that moves the substrate along a movement plane; and a position detector according to claim 48 that calculates arrangement information of the divided areas on the substrate mounted on the stage unit.

* * * * *